United States Patent
Hshieh et al.

(10) Patent No.: US 7,364,994 B2
(45) Date of Patent: *Apr. 29, 2008

(54) METHOD FOR MANUFACTURING A SUPERJUNCTION DEVICE WITH WIDE MESAS

(75) Inventors: Fwu-Iuan Hshieh, Saratoga, CA (US); Koon Chong So, Tempe, AZ (US); Brian D. Pratt, Tracy, CA (US)

(73) Assignee: Third Dimension (3D) Semiconductor, Inc., Tempe, AZ (US)

( * ) Notice: Subject to any disclaimer, the term of this patent is extended or adjusted under 35 U.S.C. 154(b) by 98 days.

This patent is subject to a terminal disclaimer.

(21) Appl. No.: 11/420,490

(22) Filed: May 26, 2006

(65) Prior Publication Data
US 2006/0205174 A1   Sep. 14, 2006

Related U.S. Application Data

(63) Continuation of application No. 11/017,468, filed on Dec. 20, 2004, now Pat. No. 7,052,982.

(60) Provisional application No. 60/530,955, filed on Dec. 19, 2003, provisional application No. 60/531,585, filed on Dec. 19, 2003.

(51) Int. Cl.
*H01L 21/425* (2006.01)
*H01L 21/336* (2006.01)
*H01L 21/332* (2006.01)
*H01L 21/44* (2006.01)
*H01L 23/58* (2006.01)

(52) U.S. Cl. .................. 438/525; 438/514; 438/138; 438/268; 438/672; 257/492; 257/493

(58) Field of Classification Search .......... 438/525, 438/514, 138, 268, 672; 257/492, 493
See application file for complete search history.

(56) References Cited

U.S. PATENT DOCUMENTS

| 4,158,206 A | 6/1979 | Neilson |
| 4,895,810 A | 1/1990 | Meyer et al. |
| 5,019,522 A | 5/1991 | Meyer et al. |
| 5,045,903 A | 9/1991 | Meyer et al. |
| 5,216,275 A | 6/1993 | Chen |
| 5,349,224 A * | 9/1994 | Gilbert et al. .......... 257/333 |
| 5,366,914 A | 11/1994 | Takahashi et al. |

(Continued)

*Primary Examiner*—Luan Thai
(74) *Attorney, Agent, or Firm*—Panitch Schwarze Belisario & Nadel LLP

(57) ABSTRACT

A method of manufacturing a semiconductor device includes providing semiconductor substrate having trenches and mesas. At least one mesa has first and second sidewalls. The method includes angularly implanting a dopant of a second conductivity into the first sidewall, and angularly implanting a dopant of a second conductivity into the second sidewall. The at least one mesa is converted to a pillar by diffusing the dopants into the at least one mesa. The pillar is then converted to a column by angularly implanting a dopant of the first conductivity into a first sidewall of the pillar, and by angularly implanting the dopant of the first conductivity type into a second sidewall of the pillar. The dopants are then diffused into the pillar to provide a P-N junction of the first and second doped regions located along the depth direction of the adjoining trench. Finally, the trenches are filled with an insulating material.

22 Claims, 27 Drawing Sheets

U.S. PATENT DOCUMENTS

| | | |
|---|---|---|
| 5,435,888 A | 7/1995 | Kalnitsky et al. |
| 5,472,888 A | 12/1995 | Kinzer |
| 5,506,421 A | 4/1996 | Palmour |
| 5,598,018 A | 1/1997 | Lidow et al. |
| 5,742,087 A | 4/1998 | Lidow et al. |
| 5,744,994 A | 4/1998 | Williams |
| 5,780,340 A * | 7/1998 | Gardner et al. ............. 438/259 |
| 5,786,619 A | 7/1998 | Kinzer |
| 5,902,127 A | 5/1999 | Park |
| 5,929,690 A | 7/1999 | Williams |
| 5,939,754 A | 8/1999 | Hoshi |
| 6,069,043 A * | 5/2000 | Floyd et al. ................ 438/270 |
| 6,081,009 A | 6/2000 | Neilson |
| 6,184,555 B1 | 2/2001 | Tihanyi et al. |
| 6,190,970 B1 | 2/2001 | Liao et al. |
| 6,198,127 B1 | 3/2001 | Kocon |
| 6,214,698 B1 | 4/2001 | Liaw et al. |
| 6,222,229 B1 | 4/2001 | Herbert et al. |
| 6,239,463 B1 | 5/2001 | Williams et al. |
| 6,265,281 B1 | 7/2001 | Reinberg |
| 6,291,856 B1 | 9/2001 | Miyasaka et al. |
| 6,300,171 B1 | 10/2001 | Frisina |
| 6,307,246 B1 | 10/2001 | Nitta et al. |
| 6,359,309 B1 | 3/2002 | Liao et al. |
| 6,362,505 B1 | 3/2002 | Tihanyi |
| 6,391,723 B1 | 5/2002 | Frisina |
| 6,410,958 B1 | 6/2002 | Usi et al. |
| 6,452,230 B1 | 9/2002 | Boden, Jr. |
| 6,459,142 B1 | 10/2002 | Tihanyi |
| 6,465,325 B2 | 10/2002 | Ridley et al. |
| 6,495,421 B2 | 12/2002 | Luo |
| 6,501,130 B2 | 12/2002 | Disney |
| 6,501,146 B1 | 12/2002 | Harada |
| 6,504,230 B2 | 1/2003 | Deboy et al. |
| 6,509,220 B2 | 1/2003 | Disney |
| 6,512,267 B2 | 1/2003 | Kinzer et al. |
| 6,635,906 B1 | 10/2003 | Chen |
| 6,787,872 B2 | 9/2004 | Kinzer et al. |
| 2002/0070418 A1 | 6/2002 | Kinzer et al. |

* cited by examiner

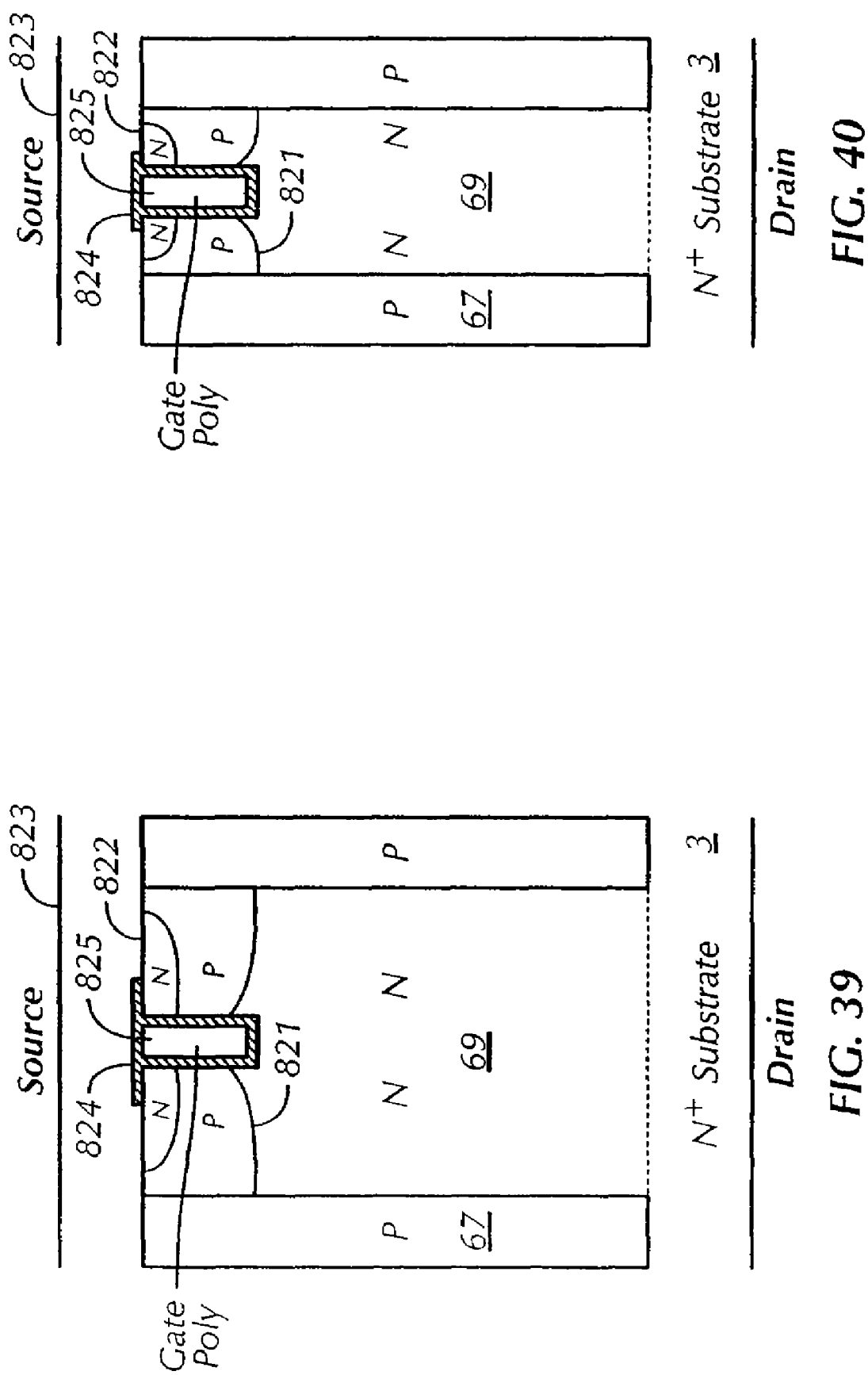

METHOD FOR MANUFACTURING A SUPERJUNCTION DEVICE WITH WIDE MESAS

CROSS-REFERENCE TO RELATED APPLICATIONS

This application is a continuation of U.S. Non-Provisional application Ser. No. 11/017,468, filed Dec. 20, 2004 now U.S. Pat. No. 7,052,982 entitled "Method for Manufacturing a Superjunction Device With Wide Mesas" which claimed priority to U.S. Provisional Application No. 60/530,955, filed Dec. 19, 2003, entitled "A Superjunction Device," and to U.S. Provisional Application No. 60/531,585, filed Dec. 19, 2003, entitled "A Superjunction Device," the disclosures of which are incorporated herein by reference.

BACKGROUND OF THE INVENTION

The present invention relates to a method for manufacturing a semiconductor device and in particular to a method of manufacturing superjunction semiconductor devices having wide mesas.

Since the invention of superjunction devices by Dr. Xingbi Chen, as disclosed in U.S. Pat. No. 5,216,275, there have been many attempts to expand and improve on the superjunction effect of his invention. U.S. Pat. Nos. 6,410,958, 6,300,171 and 6,307,246 are examples of such efforts and are incorporated herein by reference.

U.S. Pat. No. 6,410,958 ("Usui, et al.") relates to an edge termination structure and a drift region for a semiconductor component. A semiconductor body of the one conductivity type has an edge area with a plurality of regions of the other conductivity type embedded in at least two mutually different planes. Underneath the active zone of the semiconductor component, the drift regions are connected using the underlying substrate.

U.S. Pat. No. 6,307,246 ("Nitta, et al.") discloses a semiconductor component having a high-voltage sustaining edge structure in which a multiplicity of parallel-connected individual components are disposed in a multiplicity of cells of a cell array. In an edge region, the semiconductor component has cells with shaded source zone regions. During commutation of the power semiconductor component, the shaded source zone regions suppress the switching "on" of a parasitic bipolar transistor caused by the disproportionately large reverse flow current density. Moreover, an edge structure having shaded source zone regions can be produced very easily in technological terms that are discussed in the Nitta, et al. patent. It clarifies the effects of parameters and enables the mass production of a superjunction semiconductor device which has a drift layer composed of a parallel PN layer that conducts electricity in the "on" state and is depleted in the "off" state. The net quantity of active impurities in the N-type drift regions is within the range of 100% to 150% of the net quantity of active impurities in the P-type partition regions. In addition, the width of either one of the N-type drift regions and the P-type partition regions is within the range between 94% and 106% of the width of the other regions.

U.S. Pat. No. 6,300,171 ("Frisina") discloses a method for manufacturing an edge structure for a high voltage semiconductor device, including a first step of forming a first semiconductor layer of a first conductivity type, a second step of forming a first mask over the top surface of the first semiconductor layer, a third step of removing portions of the first mask in order to form at least one opening in it, a fourth step of introducing dopant of a second conductivity type in the first semiconductor layer through the at least one opening, a fifth step of completely removing the first mask and of forming a second semiconductor layer of the first conductivity type over the first semiconductor layer, a sixth step of diffusing the dopant implanted in the first semiconductor layer in order to form a doped region of the second conductivity type in the first and second semiconductor layers. The second step up to the sixth step are repeated at least one time in order to form a final edge structure including a number of superimposed semiconductor layers of the first conductivity type and at least two columns of doped regions of the second conductivity type, the columns being inserted in the number of superimposed semiconductor layers and formed by superimposition of the doped regions subsequently implanted through the mask openings, the columns near the high voltage semiconductor device being deeper than the columns farther from the high voltage semiconductor device.

It is desirable to provide a method for manufacturing a superjunction device with wide mesas. It is also desirable to provide a method for manufacturing a superjunction device utilizing micro-electro-mechanical systems (MEMS) technology to machine the semiconductor substrate during processing.

BRIEF SUMMARY OF THE INVENTION

Briefly stated, the present invention comprises a method of manufacturing a semiconductor device. To begin the process, a semiconductor substrate having first and second main surfaces opposite to each other is provided. The semiconductor substrate has a heavily doped region of a first conductivity type at the second main surface and has a lightly doped region of the first conductivity type at the first main surface. A plurality of trenches and a plurality of mesas are provided in the semiconductor substrate with each mesa having an adjoining trench and a first extending portion extending from the first main surface toward the heavily doped region to a first depth position. At least one mesa has a first sidewall surface and a second sidewall surface. Each of the plurality of trenches has a bottom. The method includes implanting, at a first predetermined angle of implant, a dopant of a second conductivity type into the first sidewall surface of the at least one mesa to form a first doped region of the second conductivity type. The method also includes implanting, at a second predetermined angle of implant, a dopant of a second conductivity type into the second sidewall surface of the at least one mesa to form a third doped region of the second conductivity type. Subsequently, the at least one mesa is converted to a pillar by diffusing the implanted dopants into the at least one mesa. The pillar is then converted to a column by implanting, at the first predetermined angle of implant, a dopant of the first conductivity type into a first sidewall surface of the pillar to provide a second doped region of the first conductivity type at the first sidewall, and by implanting, at the second predetermined angle of implant, the dopant of the first conductivity type into a second sidewall opposite the first sidewall surface of the pillar. The implanted dopants are then diffused into the pillar to provide a second doped region of the first conductivity type at the second sidewall and to provide a P-N junction of the first and second doped regions located along the depth direction of the adjoining trench. Finally, the plurality of trenches are filled with an insulating material.

In another aspect, the present invention comprises a method of manufacturing a semiconductor device. To begin the process, a semiconductor substrate having first and second main surfaces opposite to each other is provided. The semiconductor substrate has a heavily doped region of a first conductivity type at the second main surface and has a lightly doped region of the first conductivity type at the first main surface. A plurality of trenches and a plurality of mesas are provided with each mesa having an adjoining trench and a first extending portion extending from the first main surface toward the heavily doped region to a first depth position. At least one mesa has a first sidewall surface and a second sidewall surface. Each of the plurality of trenches has a bottom. The method includes implanting, at a first predetermined angle of implant, a dopant of a first conductivity type into the first sidewall surface of the at least one mesa to form a first doped region of the first conductivity type. The method also includes implanting, at a second predetermined angle of implant, a dopant of the first conductivity type into the second sidewall surface of the at least one mesa to form a second doped region of the first conductivity type. The at least one mesa is converted to a pillar by diffusing the implanted dopants into the at least one mesa. The pillar is then converted to a column by implanting, at the first predetermined angle of implant, a dopant of the second conductivity type into a first sidewall surface of the pillar to provide a second doped region of the first conductivity type at the first sidewall, and implanting, at the second predetermined angle of implant, the dopant of the second conductivity type into a second sidewall opposite the first sidewall surface of the pillar. The implanted dopants are then diffused into the pillar to provide a first doped region of the second conductivity type at the second sidewall. Finally, the plurality of trenches are with an insulating material.

BRIEF DESCRIPTION OF SEVERAL VIEWS OF THE DRAWINGS

The foregoing summary, as well as the following detailed description of preferred embodiments of the invention, will be better understood when read in conjunction with the appended drawings. For purposes of illustrating the invention, there are shown in the drawings embodiments which are presently preferred. It should be understood, however, that the invention is not limited to the precise arrangements and instrumentalities shown.

FIG. 29 is a partial sectional elevational view of a cell description of a planar metal-oxide semiconductor field effect transistor (MOSFET) N type structure using a standard planar process in accordance with the second preferred embodiment;

FIG. 30 is a partial sectional elevational view of a cell description of a planar metal-oxide semiconductor field effect transistor (MOSFET) N type structure using a standard planar process having a narrow pitch in accordance with the second preferred embodiment;

FIG. 39 is a partial sectional elevational view of a cell description of a trench metal-oxide semiconductor field effect transistor (MOSFET) N type structure using a standard trench process in accordance with the second preferred embodiment;

FIG. 40 is a partial sectional elevational view of a cell description of a trench metal-oxide semiconductor field effect transistor (MOSFET) N type structure using a standard trench process having a narrow pitch in accordance with the second preferred embodiment;

DETAILED DESCRIPTION OF THE INVENTION

Figure 1:
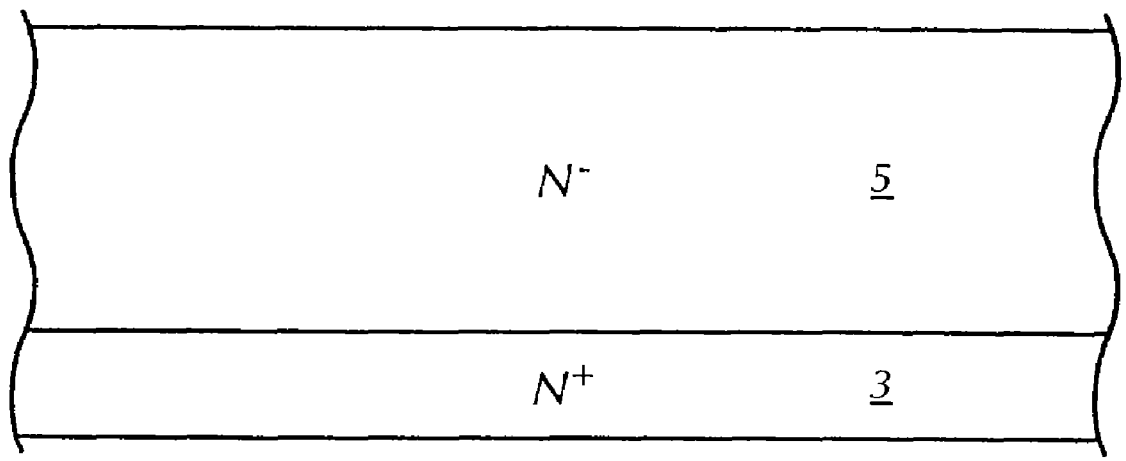
FIG. 1 is a partial sectional elevational view of an N type semiconductor substrate in accordance with a first preferred embodiment of the present invention.

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a", as used in the claims and in the corresponding portions of the specification, means "at least one."

FIGS. 1-11 generally show a process for manufacturing an N type structure in accordance with a first preferred embodiment of the present invention.

Referring to FIG. 1, there is shown a partial elevational view of a semiconductor wafer that includes an N⁺ substrate 3 and an N⁻ epitaxial layer 5. As used herein, reference to conductivity will be limited to the embodiment described. However, those skilled in the art know that P-type conductivity can be switched with N-type conductivity and the device would still be functionally correct (i.e., a first or a second conductivity type). Therefore, where used herein, the reference to N or P can also mean that either N and P or P and N can be substituted. Metal oxide semiconductor field effect transistor (MOSFET)-gated devices such as insulated gate bipolar transistors (IGBTs) can be fabricated in an epitaxial wafer with an N-type epitaxial layer over a P⁺ substrate (or visa versa).

Figure 2:
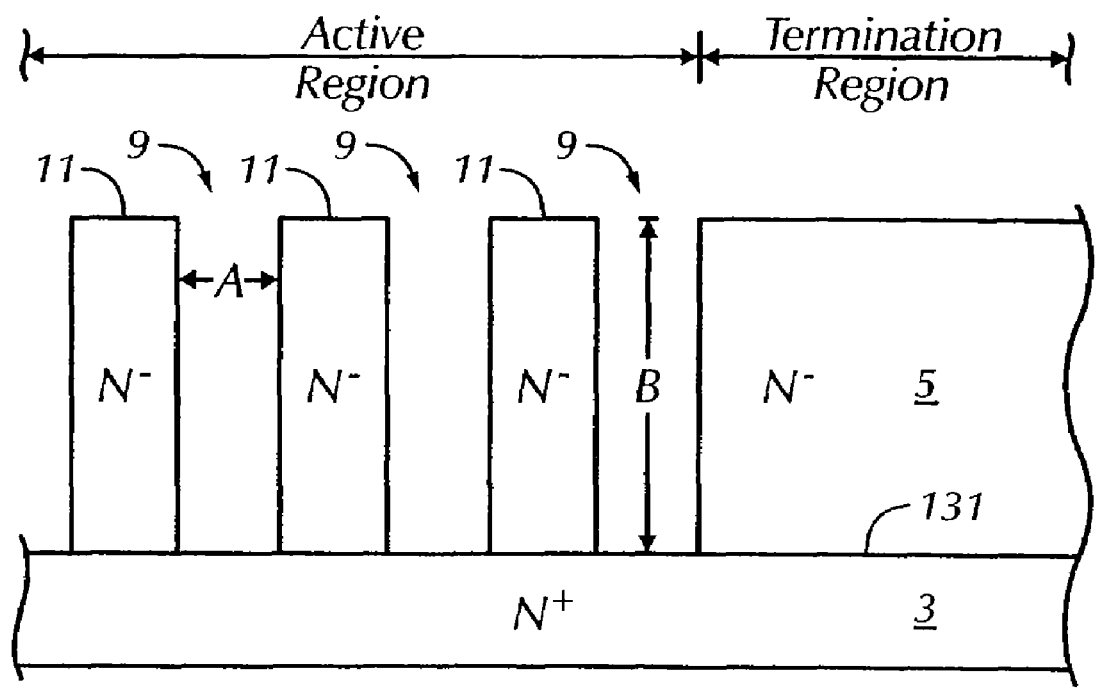
FIG. 2 is a partial sectional elevational view of the semiconductor substrate of FIG. 1 after an etch step.

Referring to FIG. 2, using techniques known in the art, the epitaxial layer 5 is etched to touch or to approach the interface 131 between the substrate 3 and the epitaxial layer 5. The etch process creates trenches 9 and mesas 11. The mesas 11, which are the "device mesas," will be used to form the voltage sustaining layer for each transistor or active device cell manufactured by the process. The mesas 11 are referred to as device mesas because the mesas 11 are in an active region, as opposed to a surrounding termination or edge termination region. The active region is the area on which semiconductor devices will be formed, and the termination region is an area which provides insulation between cells of active devices.

The separation of the mesas 11, i.e., the width A of the trenches 9, and the depth B of the trenches 9 is used to determine an implantation angel Φ, Φ' (i.e., a first or second angle of implant Φ, Φ') of ion implants that are to be performed and discussed later. For the same reason, the width A between the mesas 11 and the edge termination region is also approximately the same distance. Though not shown clearly, in some embodiments the trenches 9 are preferably slightly wider at their tops by about 1%-10% than at their bottoms to facilitate the trench fill process when the trenches 9 are to be filled with grown oxide. Consequently, the mesas 11, in embodiments with trenches 9 having wider tops, have a first sidewall surface with a predetermined inclination maintained relative to the first main surface and a second sidewall surface with a predetermined inclination maintained relative to the first main surface. The inclination of the first sidewall surface is about the same as the inclination of the second sidewall surface depending on tolerances of the etching process.

In other embodiments where the trenches 9 are filled with deposited oxide it is desirable to have the sidewalls of the mesas 11 as vertical as possible. While the first trenches 9 extend from the first main surface of the epitaxial layer 5 toward the substrate (heavily doped region) 3 to the first depth position by depth B, the first trenches 9 do not necessarily extend all the way to the substrate (heavily doped region) 3.

Preferably, the etching is performed by utilizing micro-electro-mechanical systems (MEMS) technology to machine the semiconductor substrate during processing. MEMS technology permits deeper trenches 9 with much straighter sidewalls. Utilizing MEMS technology, trenches 9 can be formed having depths B of about 40 to 100 micrometers or microns (μm) or even deeper. Furthermore, forming deeper trenches 9 that have straighter sidewalls than conventionally etched or formed trenches 9, results in a final superjunction device with enhanced avalanche breakdown voltage ($V_b$) characteristics as compared to conventional semiconductor-transistor devices (i.e., the avalanche breakdown voltage ($V_b$) can be increased to about 600 to 650 Volts or more). MEMS technology (i.e., machining for trenching, etching, planarizing and the like) can be utilized with any of the embodiments of the present invention.

The sidewalls of each trench 9 may be smoothed, if needed, using one or more of the following process steps:
an isotropic plasma etch may be used to remove a thin layer of silicon (typically 100-1000 Angstroms) from the trench surfaces.
a sacrificial silicon dioxide layer 6 may be grown on the surfaces of the trench and then removed using an etch such as a buffered oxide etch or a diluted hydrofluoric (HF) acid etch.

The use of either or both of these techniques can produce smooth trench surfaces with rounded corners while removing residual stress and unwanted contaminates. However, in the embodiments where it is desirable to have vertical sidewalls and square corners, an anisotropic etch process will be used instead of the isotropic etch process discussed above. Anisotropic etching, in contrast to isotropic etching, generally means different etch rates in different directions in the material being etched.

Figure 3:
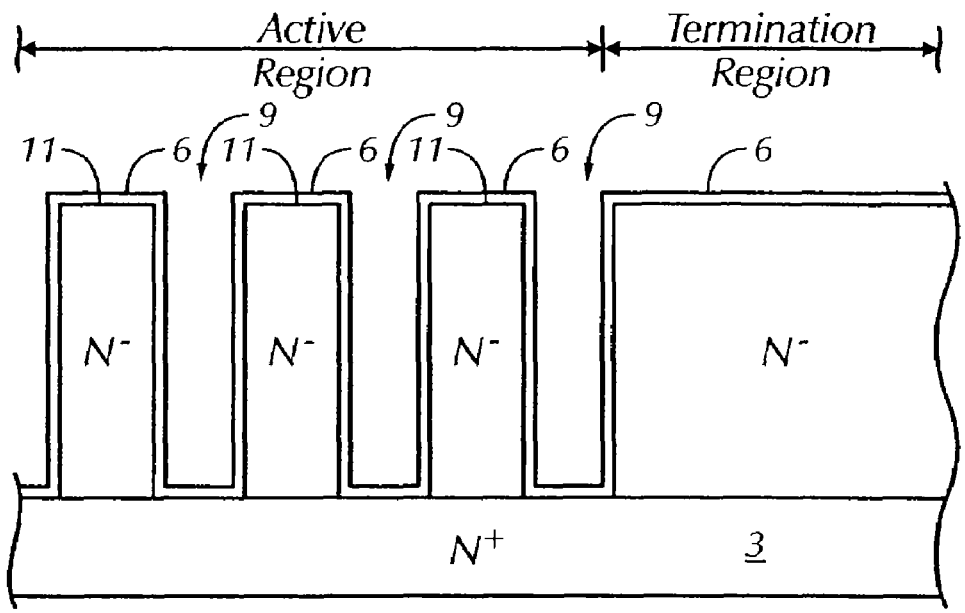
FIG. 3 is a partial sectional elevational view of the semiconductor substrate of FIG. 2 after an oxidation step.

FIG. 3 is a partial sectional view of a semiconductor wafer following an oxidation step using techniques known in the art. An oxidation layer 6 is masked in preparation for an etch step that follows. The sacrificial silicon dioxide layer 6 has a thickness about 200 Angstroms to 1,000 Angstroms which will insure that, following ion implantation as described below, the dopants are retained within mesas 11. As used herein, "oxide" when used alone refers to silicon dioxide.

Figure 4:
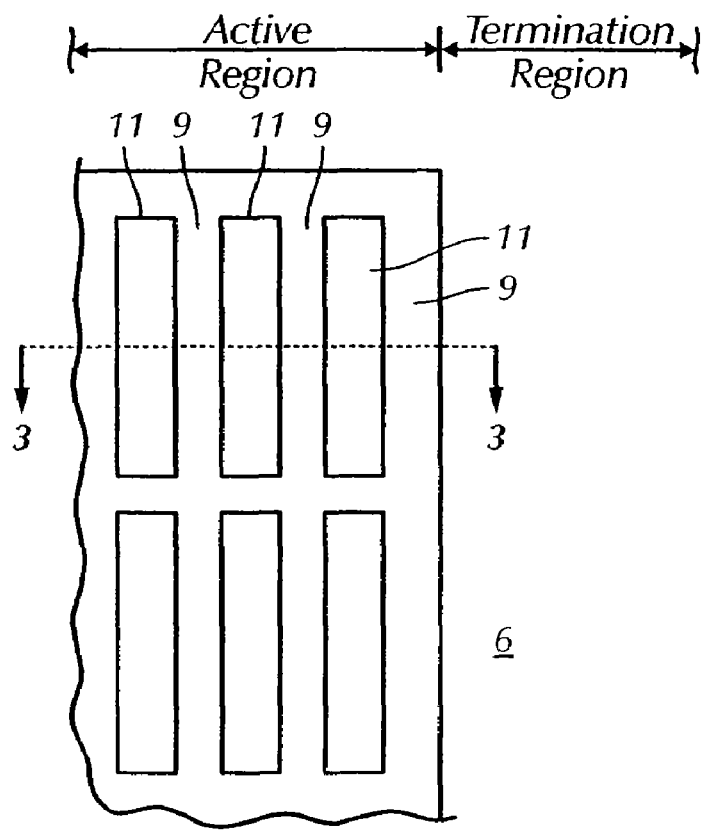
FIG. 4 is a top plan view of the substrate of FIG. 3.

FIG. 4 is a top plane view of the wafer of FIG. 3, where a plurality of device mesas 11 and trenches 9 are shown. As will be seen in the next step, the device mesas 11 are implanted with ions and following which the ions are driven into the device. FIG. 4 shows one of many possible top plan views of the substrate. FIG. 4 shows a stripe design (i.e., mesas 11 in rows and columns) instead of a polygonal cell layout, but the embodiments do not necessarily preclude a polygonal cell structure. Many other geometrical arrangements of trenches 9 and mesas 11 are also contemplated without departing from the invention.

Figure 5:
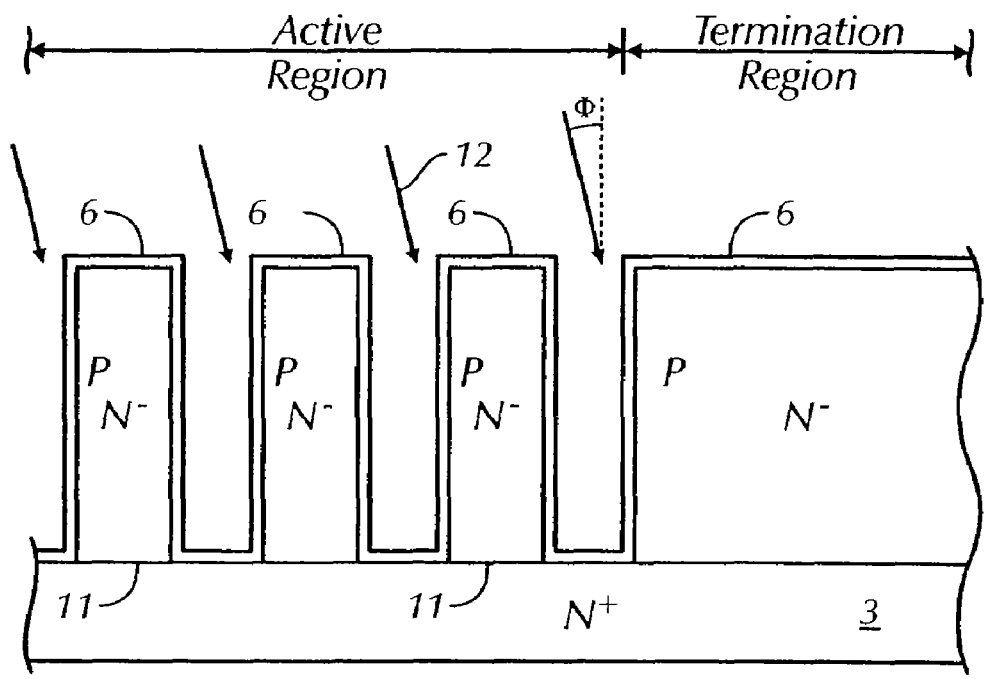
FIG. 5 is a partial sectional elevational view of the semiconductor substrate of FIG. 3 showing a P conductivity ion implant at a first predetermined angle of implant.

Referring to FIG. 5, at a slight angel Φ (i.e., a first predetermined angle of implant Φ), without benefits of a masking step, the mesas 11 are implanted by boron (B) (i.e., a dopant having a second conductivity) on one side at a high energy level in the range of about 40 to 1000 KeV. Preferably, the energy level is in the range of about 200 to 1000 KeV, but it should be recognized that the energy level should be selected to sufficiently implant the dopant. The first predetermined angle of implant Φ, as represented by the arrows 12, is determined by the width A between the mesas 11 and the depth B of the trenches 9 and can be between about 2° and 12° from vertical and for the embodiment shown the angle Φ was at about 4°. The use of the width A and depth B to determine the first predetermined angle of implant Φ ensures that only the sidewalls of the trenches 9 in the active region will be implanted. Consequently, a dopant of the second conductivity type is implanted, at a first predetermined angle of implant Φ, into at least one preselected mesa 11 to form at the sidewall surface of the one trench 9 a first doped region of the second conductivity type having a doping concentration lower than that of the heavily doped region.

Figure 6:
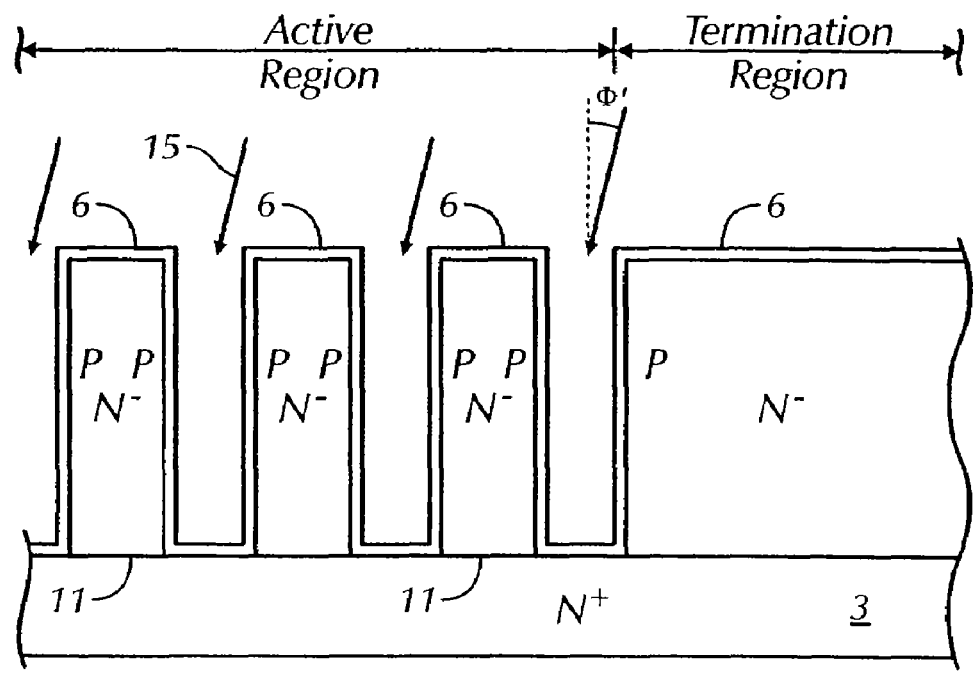
FIG. 6 is a partial sectional elevational view of the semiconductor substrate of FIG. 5 showing an P conductivity ion implant at a second predetermined angle of implant.

As shown in FIG. 6, the opposite sides of the mesas 11 are implanted with boron B at a second predetermined angle of implant Φ', as represented by arrows 15. Similar to the first predetermined angle of implant Φ, the second predetermined angle of implant Φ' is determined by the width A between the mesas 11 and the depth B of the trenches 9 and can be between about −2° and −12° from vertical and for the embodiment shown the second predetermined angle of implant Φ' was at about −4°. The use of the width A and depth B to determine the second predetermined angle of implant Φ' ensures that only the sidewalls of the trenches 9 in the active region will be implanted. Consequently, a dopant of the second conductivity type is implanted, at a second predetermined angle of implant Φ', into at least one preselected mesa 11 to form at the sidewall surface of the one trench 9 a second doped region of the second conductivity type having a doping concentration lower than that of the heavily doped region.

Figure 7:
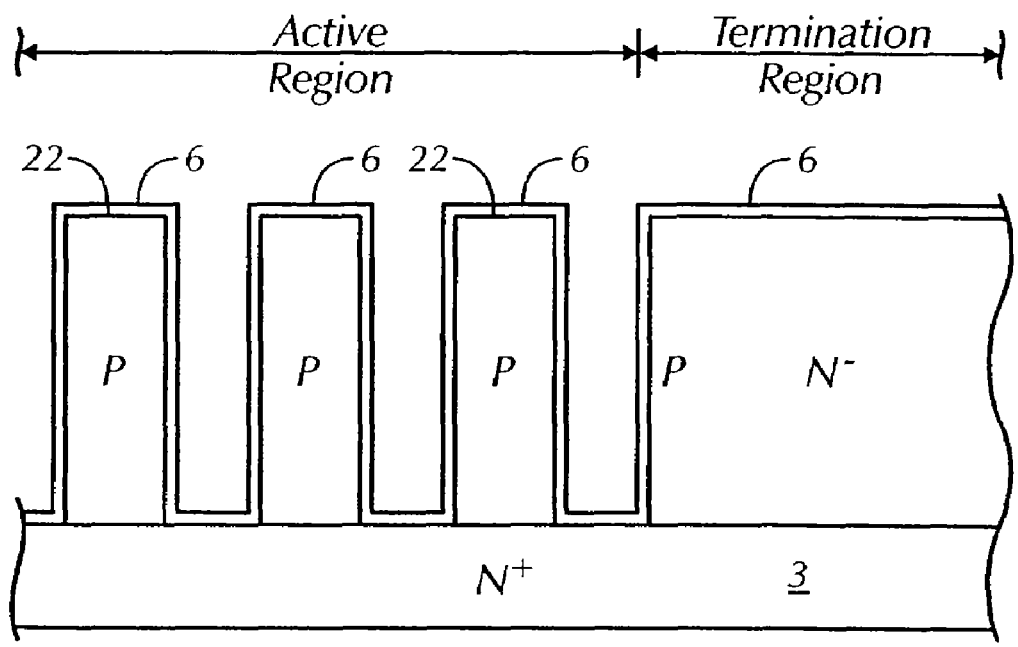
FIG. 7 is a partial sectional elevational view of the semiconductor substrate of FIG. 6 after a drive in step.

Referring to FIG. 7, following implanting the second P type implant (FIG. 6), a drive in step at a temperature of up to 1200° Celsius is performed for up to 12 hours so that the mesas 11 are converted to P columns 22. It should be recognized that the temperature and time are selected to sufficiently drive in the implanted dopant.

Figure 8:
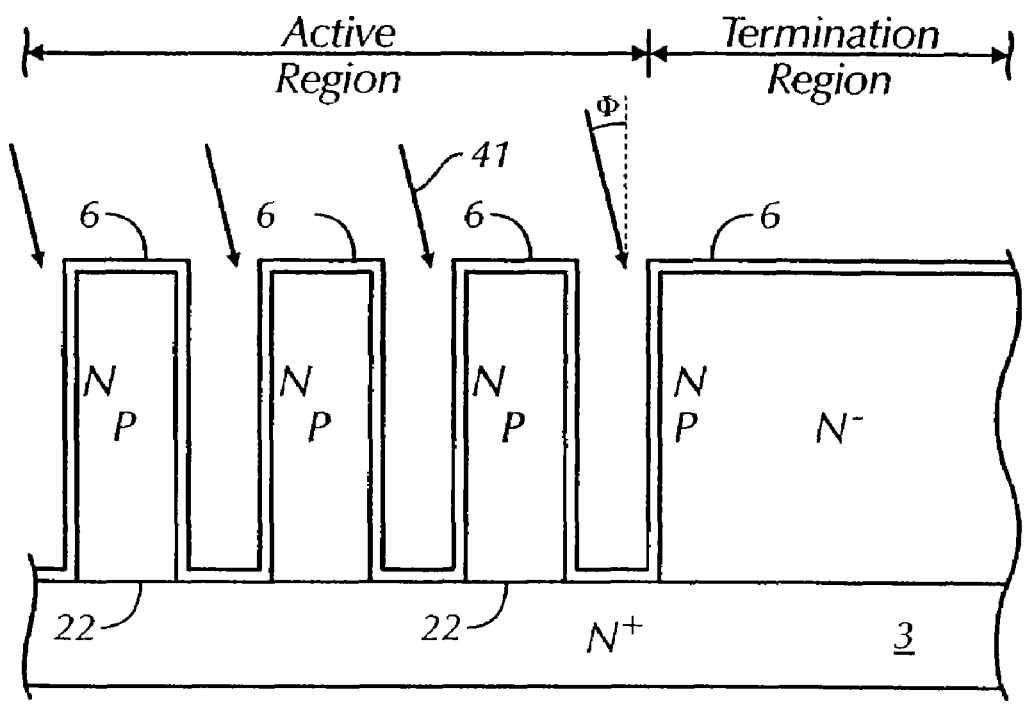
FIG. 8 is a partial sectional elevational view of the semiconductor substrate of FIG. 7 showing an N conductivity ion implant at the first predetermined angle of implant.
Figure 9:
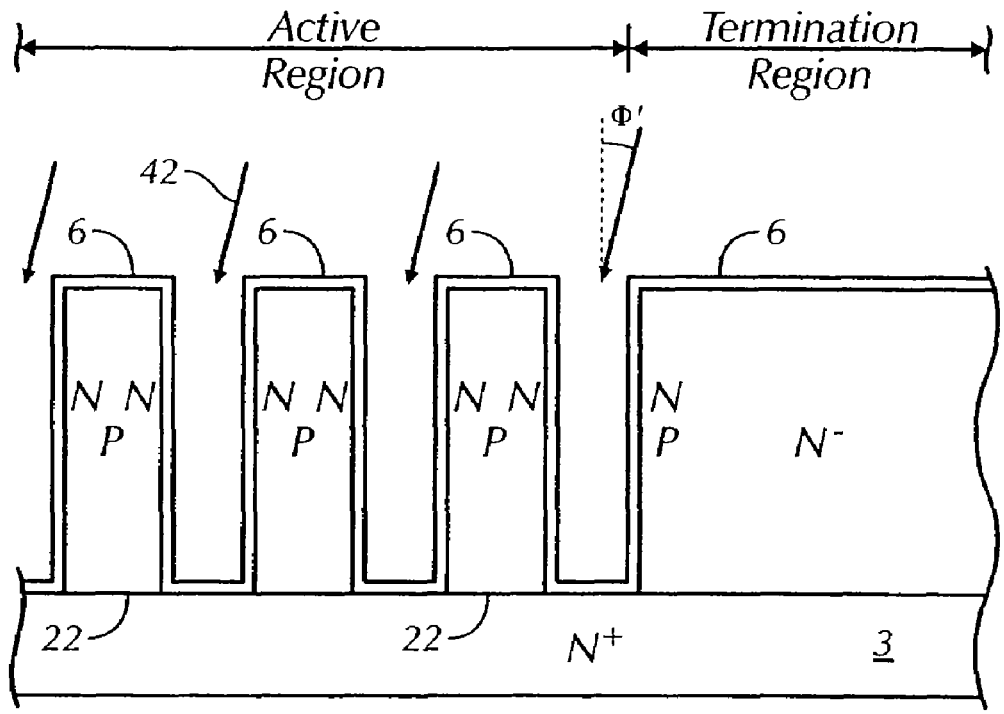
FIG. 9 is a partial sectional elevational view of the semiconductor substrate of FIG. 8 showing an N conductivity ion implant at the second predetermined angle of implant.

A second implant is then performed with an N type dopant such as phosphorous (P) or arsenic (As) as shown in FIG. 8. The N type implant is performed at the first predetermined angle of implant Φ and at an energy level of about 30 KeV to 400 KeV, as is represented by the arrows 41. Preferably, the energy level is in the range of about 40 to 300 KeV, but it should be recognized that the energy level should be selected to sufficiently implant the dopant. In FIG. 9 the opposite sides of the mesas 11 are implanted with the N type dopant at the second predetermined angle of implant Φ', as represented by arrows 42.

Figure 10:
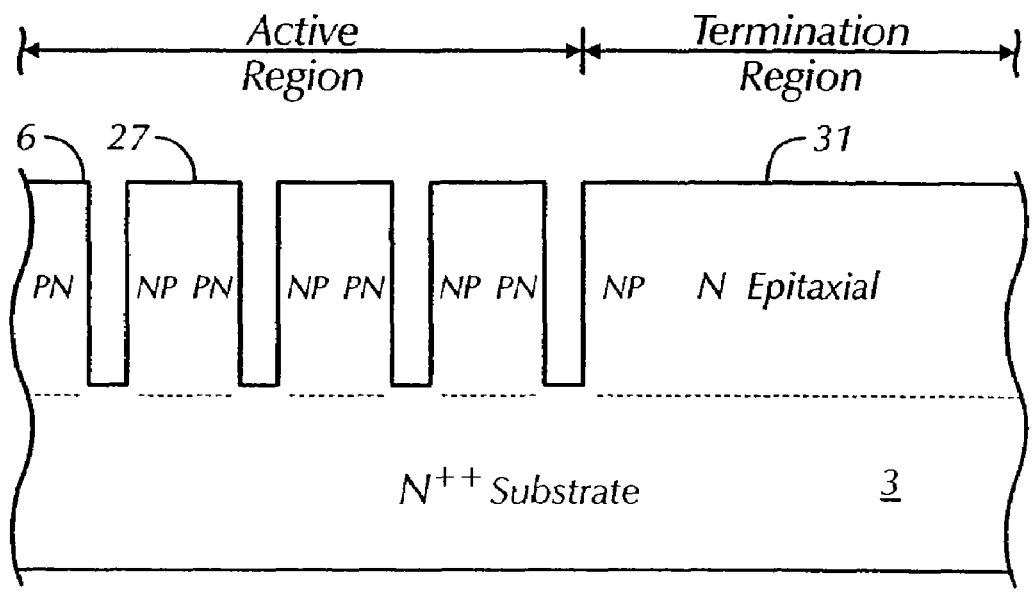
FIG. 10 is a partial sectional elevational view of the semiconductor substrate of FIG. 9 after a second drive in step.

Following the second N type implant, a drive in step at a temperature of up to 1200° Celsius is performed for up to 12 hours resulting in the P pillars 22 being converted to N/P pillars 27 and right side termination N and P region 31 as shown in FIG. 10.

Figure 11:
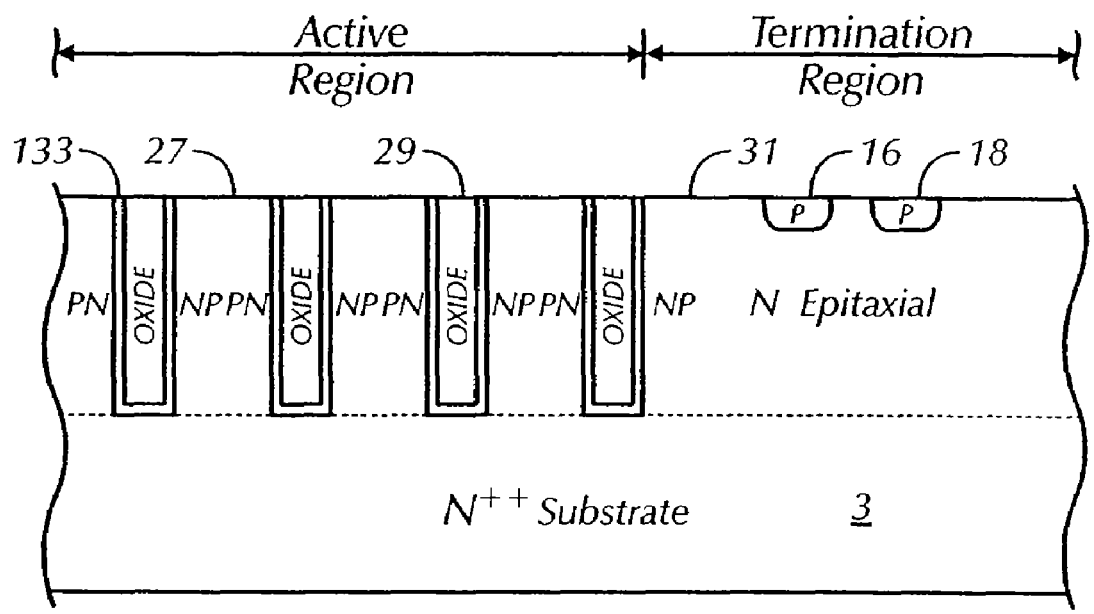
FIG. 11 is a partial sectional elevational view of the semiconductor substrate of FIG. 10 after a planarization step.

Either a steam oxidation step is performed or a deposition step such as replacing the oxide layer 6 using a technique known as low pressure (LP) chemical vapor deposition (CVD) Tetraethylorthosilicate (TEOS) or simply "LPTEOS." Alternatively, a spun-on-glass (SOG) technique or any other deposited oxide layer may be used to fill the trenches 9 with silicon dioxide (FIG. 11). N/P pillars 27 are then surrounded by the silicon dioxide 29. However, it has been found that the filling of the trenches 9 can cause the devices to warp. The warping problem can be reduced or eliminated by depositing a thin dielectric layer 133 (FIG. 11) such as silicon nitride (e.g., $Si_xN_y$) over the thin oxide layer 6. As used herein, "nitride" when used alone refers to silicon nitride.

The N/P pillars 27 are converted to N/P columns 27, so the drawings only reflect the structural area of the N/P pillars 27 or N/P columns 27 for simplicity. In general, where mesas 11 are converted to pillars and pillars are converted to columns, the same number may point to the same area in the drawings for simplification, realizing that the structures have been "converted."

After planarization using chemical mechanical polishing (CMP) by techniques known in the art, FIG. 11 shows the oxide layer 6 gone from the tops of the N/P columns 27 which are exposed in order to create the device features for the transistor. The amount of planarization is about 0.6-3.2 µm. P type termination rings 16, 18 are added.

Figure 12:
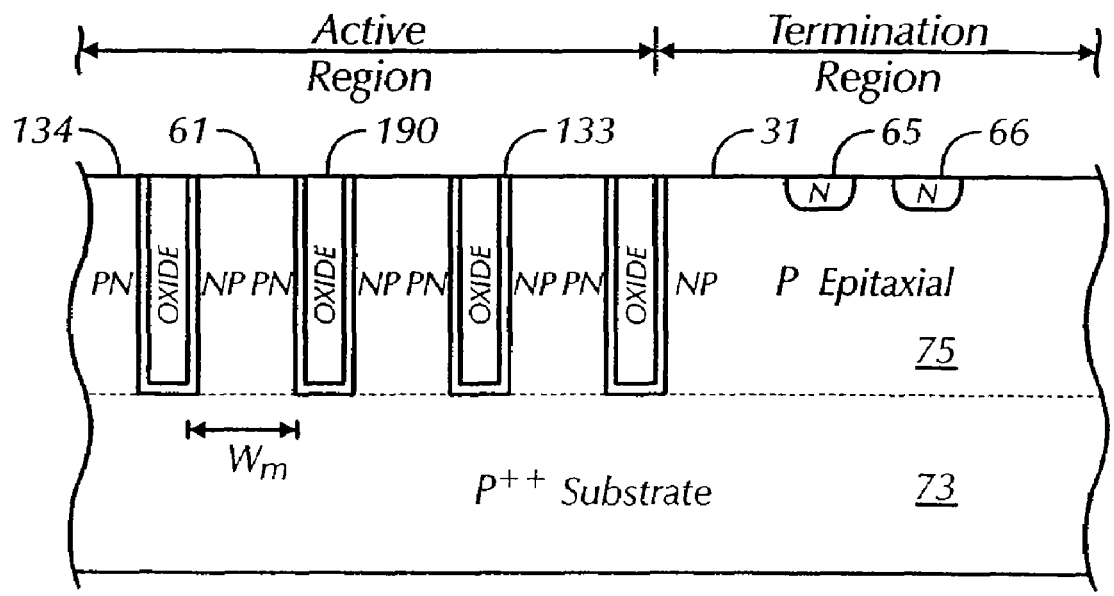
FIG. 12 is a partial sectional elevational view of a P type semiconductor substrate in accordance with an alternate of the first preferred embodiment of the present invention.
Figure 13:
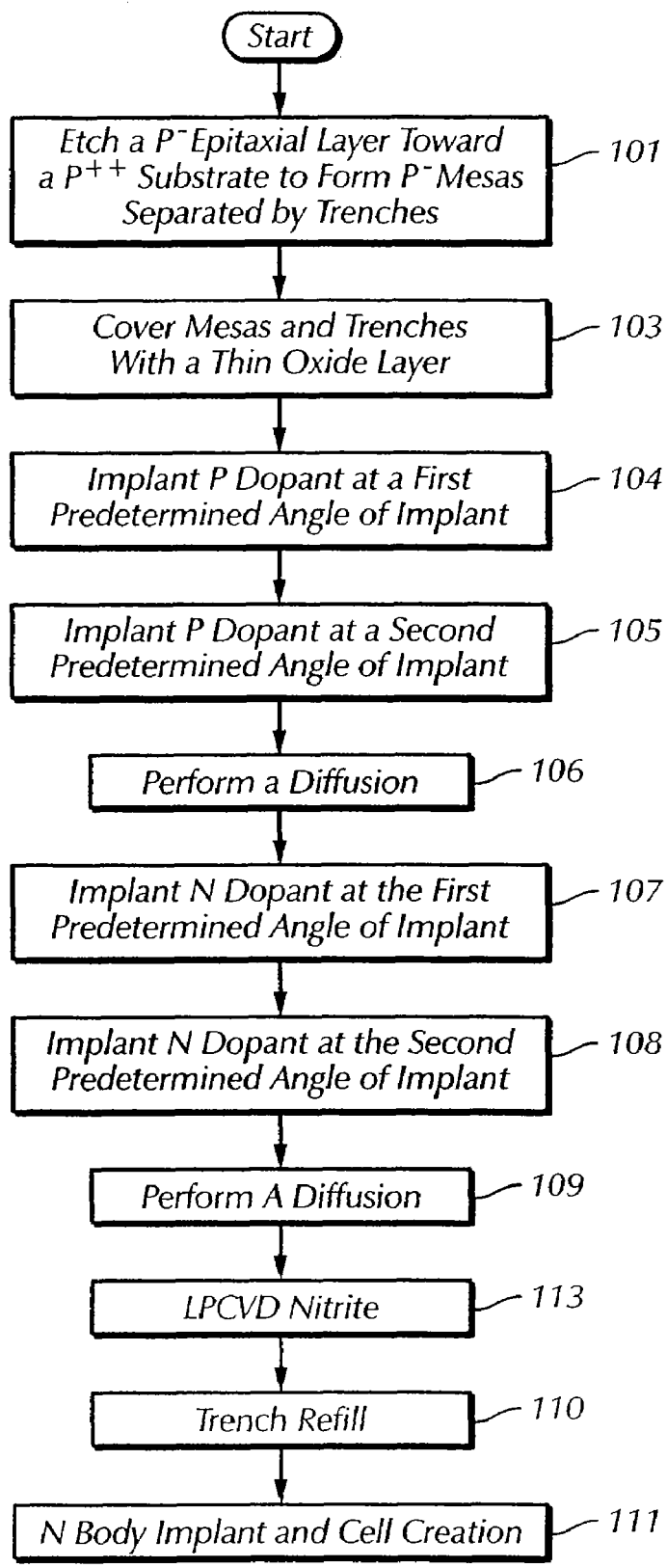
FIG. 13 is a flowchart demonstrating a process for manufacturing a P type structure in accordance with the alternate of the first preferred embodiment of the present invention.

FIGS. 12-13 generally show a process for manufacturing a P type structure in accordance with the first preferred embodiment of the present invention. FIG. 12 is an alternative of the first embodiment shown in FIGS. 1-11 and is similarly manufactured.

Wide columns or mesas 61 are shown having a width $W_M$ that is wider than mesas of conventional devices, although $W_M$ may vary among the preferred embodiments and should not be construed as limiting.

FIG. 12 shows a $P^{++}$ substrate 73 on which a epitaxial layer 75 is formed. There are wide columns 61 that are NPPN type columns separated by a dielectric fill 190. There is a dielectric layer 134 on the surface of the columns 61 that includes a thin nitride layer 133 followed by a thin layer of silicon dioxide having a thickness on the order of about 200 angstroms to 1,000 angstroms. The columns 61 are separated by dielectric fill 190. The dielectric fill 190 may be silicon nitride, doped or undoped oxide, semi-insulating material and the like. The semi-insulating material can be undoped polysilicon or semi-insulating polycrystalline silicon (SIPOS).

FIG. 13 is a flowchart which briefly outlines the steps used to manufacture the device of FIG. 12. As in the approach of the N type structure (discussed above), a P epitaxial layer is etched toward a $P^{++}$ substrate to form P mesas separated by trenches at step 101. The mesas and trenches are covered with a thin oxide layer at step 103. At step 104, a first implant is made by implanting a P dopant at the first predetermined angle of implant Φ to implant the P dopant at one side of the mesas formed by the previously etch step. Proceeding to step 105 there is a second P dopant implant at the second predetermined angle of implant Φ'. Proceeding to step 106 where a diffusion step is performed to convert the P mesas into columns 61. After which there is another implant of an N type dopant at the first predetermined angle of implant Φ at step 107 followed by a second implant step that implants the N type dopant at the second predetermined angle of implant Φ' (which is a negative of the first predetermined angle of implant Φ) at step 108. A diffusion step is performed at step 109 followed by a low pressure chemical vapor deposition step of silicon nitride at step 113. After that there is a trench refill at step 110 of a dielectric, after which the N body implant is performed and the transistor cell is created at step 111 at the same time the N body implants 65 and 66 are created.

Figure 14:
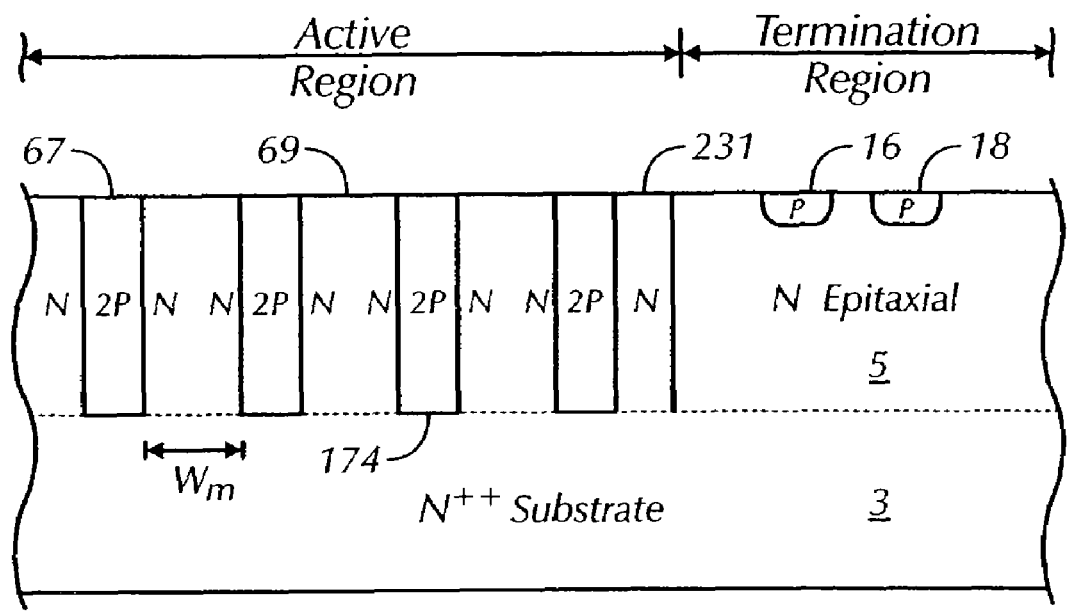
FIG. 14 is a partial sectional elevational view of an N type semiconductor substrate in accordance with a second preferred embodiment of the present invention.

FIG. 14 is a second embodiment of the N type structure which is referred to as the N-P refill approach and it includes wide columns 69 that are separated by a epitaxial refill 67 which is a double P (2P) dopant. An N termination region is also created that includes an implant 231. The process also provides for the formation of N termination or isolation rings 16 and 18.

Figure 15:
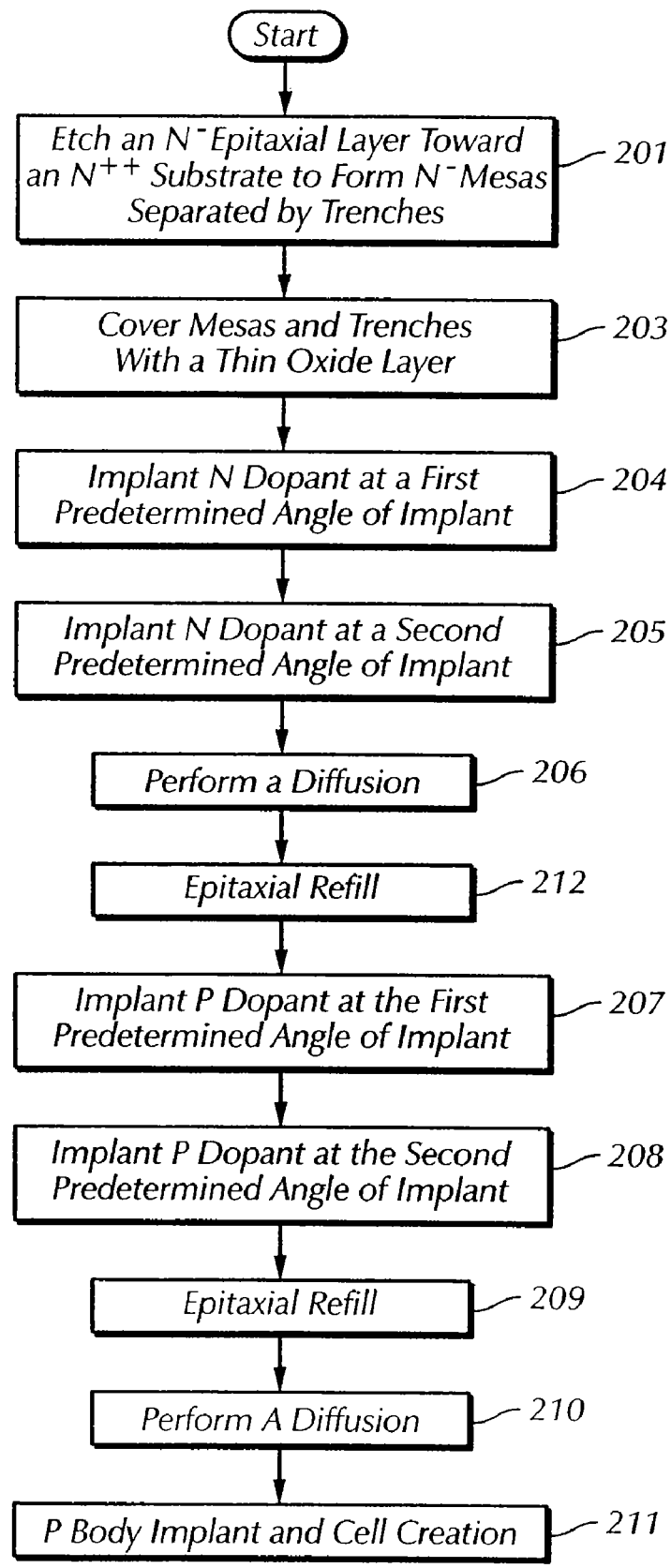
FIG. 15 is a flowchart demonstrating a process for manufacturing an N type structure in accordance with the second preferred embodiment of the present invention.
Figure 16:
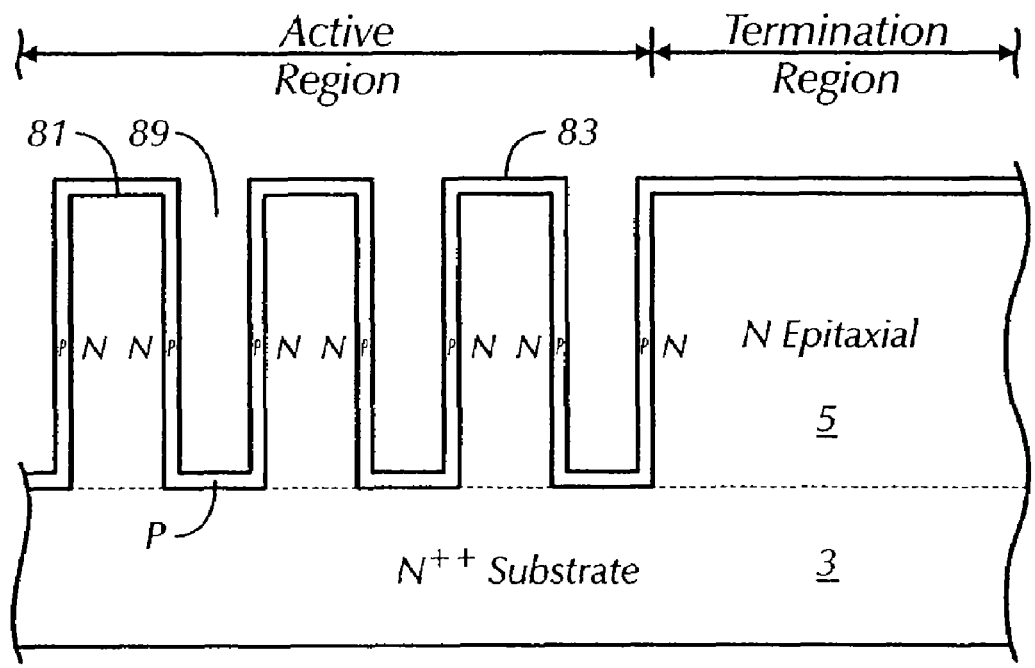
FIG. 16 is a partial sectional elevational view of an N type semiconductor substrate in accordance with the second preferred embodiment of the present invention.

FIGS. 15-16 generally show a process for manufacturing an N type structure in accordance with a second preferred embodiment of the present invention.

FIG. 15 is a flowchart which briefly outlines the steps used to manufacture the device of FIG. 16. Proceeding to FIG. 15, similar to FIGS. 1-11, the process begins with an $N^{++}$ substrate 3 having an N type epitaxial layer 5 thereon. An etch step 201 is performed where there are a plurality of trenches 89 approximately located where the epitaxial refill 67 is shown in FIG. 14, and mesas 81 created where the columns 69 are shown in FIG. 14. The mesas 81 and trenches 89, as was the case in the first embodiment, are covered with a thin oxide layer, at step 203. The purpose of the thin oxide layer is to prevent the dopant from escaping during the process. Proceeding to step 204, an N type dopant is implanted at a first predetermined angle of implant Φ, following which, at step 205, the N type dopant is implanted at a second predetermined angle of implant Φ' that is a negative of the first predetermined angle of implant Φ relative to a vertical axis. The process then proceeds to step 206 where the implanted dopants are diffused and at step 212 an epitaxial refill is performed, although the epitaxial refill does not fill all the trenches 89. The epitaxial layer at this point is implanted with a P type dopant at the first predetermined angle of implant Φ, at step 207, followed by a second implant of the P type dopant at the second predetermined angle of implant Φ' which is a negative of the first predetermined angle of implant Φ at step 208. Referring to FIG. 16, the thin epitaxial layer 83 is shown after the implant step has been performed. Thereafter, there is an epitaxial refill at step 209 and a diffusion process formed at step 210 to make sure that the trenches 89 are filled to get the epitaxial separation of the columns 69, following which the P body implant cell creation at step 211. It is this point where the termination or isolation rings 16 and 18 (FIG. 14) are also formed.

Figure 17:
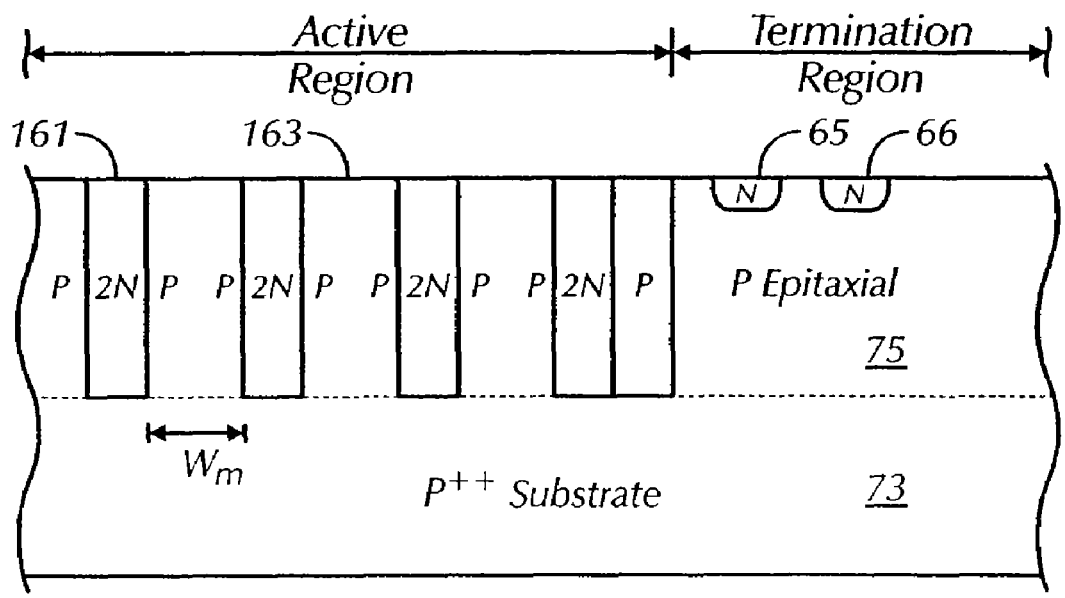
FIG. 17 is a partial sectional elevational view of a P type semiconductor substrate in accordance with an alternate of the second preferred embodiment of the present invention.
Figure 18:
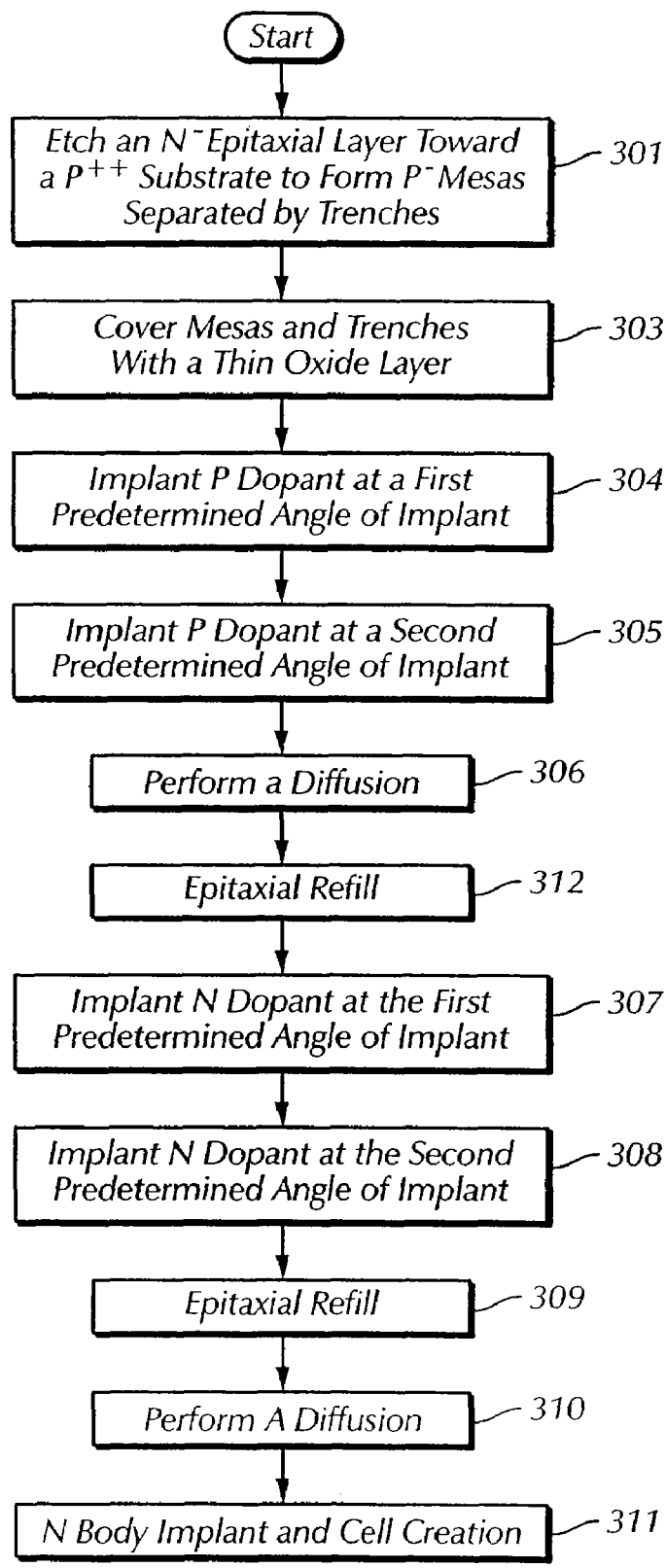
FIG. 18 is a flowchart demonstrating a process for manufacturing a P type structure in accordance with the alternate of the second preferred embodiment of the present invention.

FIGS. 17-18 generally show a process for manufacturing a P type structure in accordance with the second preferred embodiment of the present invention.

FIG. 17 illustrates the P type structure of this embodiment using an epitaxial refill approach and has a plurality of wide P type structures 163 and trenches that have been filled with 2N type epitaxial dopant 161. There are also N termination regions 65 and 66. The starting point is with a substrate 73 having an epitaxial layer 75 thereon.

FIG. 18 is a flowchart which briefly outlines the steps used to manufacture the device of FIG. 17. The process begins at step 301 with etching a P epitaxial layer 75 toward a P++ substrate 73 to form a plurality of P type mesas separated by trenches. At step 303 there is a thin oxide layer deposited to cover the mesas and trenches. Proceeding to step 304 a P type dopant is implanted at the first predetermined angle of implant Φ and following to step 305 the P type dopant is implanted at the second predetermined angle of implant Φ. As was the N type structure of the second embodiment a diffusion step is performed at step 306. Proceeding to step 312, there is a thin epitaxial refill performed at this point as was previously discussed with the N type structure. At step 307, an N type dopant is implanted at the first predetermined angle of implant Φ following which the other side of the columns are implanted with an N type dopant at step 308 at the second predetermined angle of implant Φ'. There is, at this step, an epitaxial refill at step 309 to fully fill or refill all the trenches and then the dopants are diffused at step 310. At step 311 the P body implants are performed and cell creation is done to create the termination or isolation rings 65 and 66.

Figure 19:
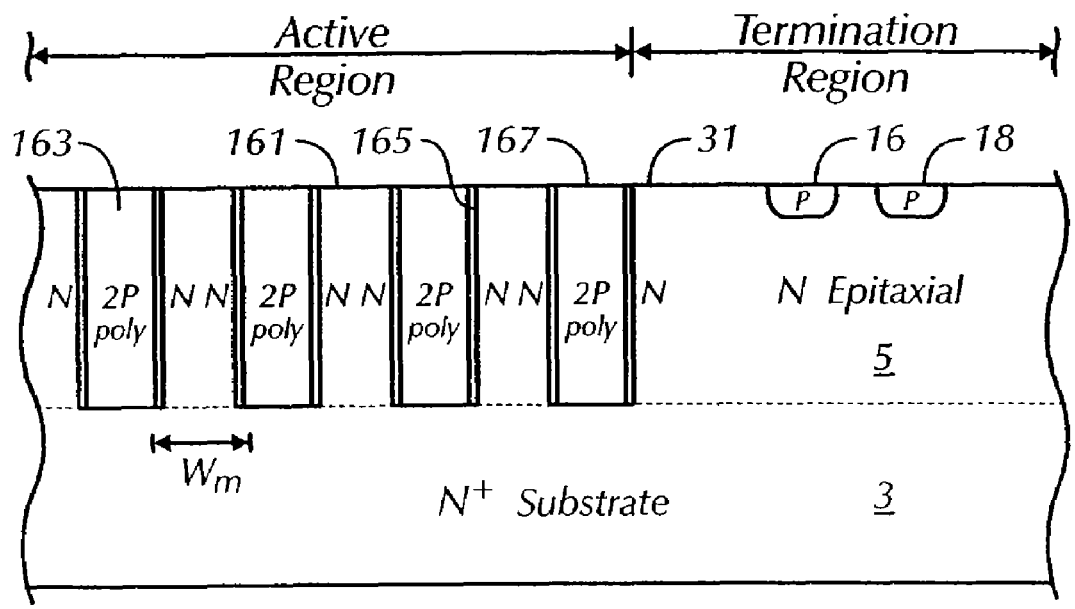
FIG. 19 is a partial sectional elevational view of an N type semiconductor substrate in accordance with a third preferred embodiment of the present invention.
Figure 20:
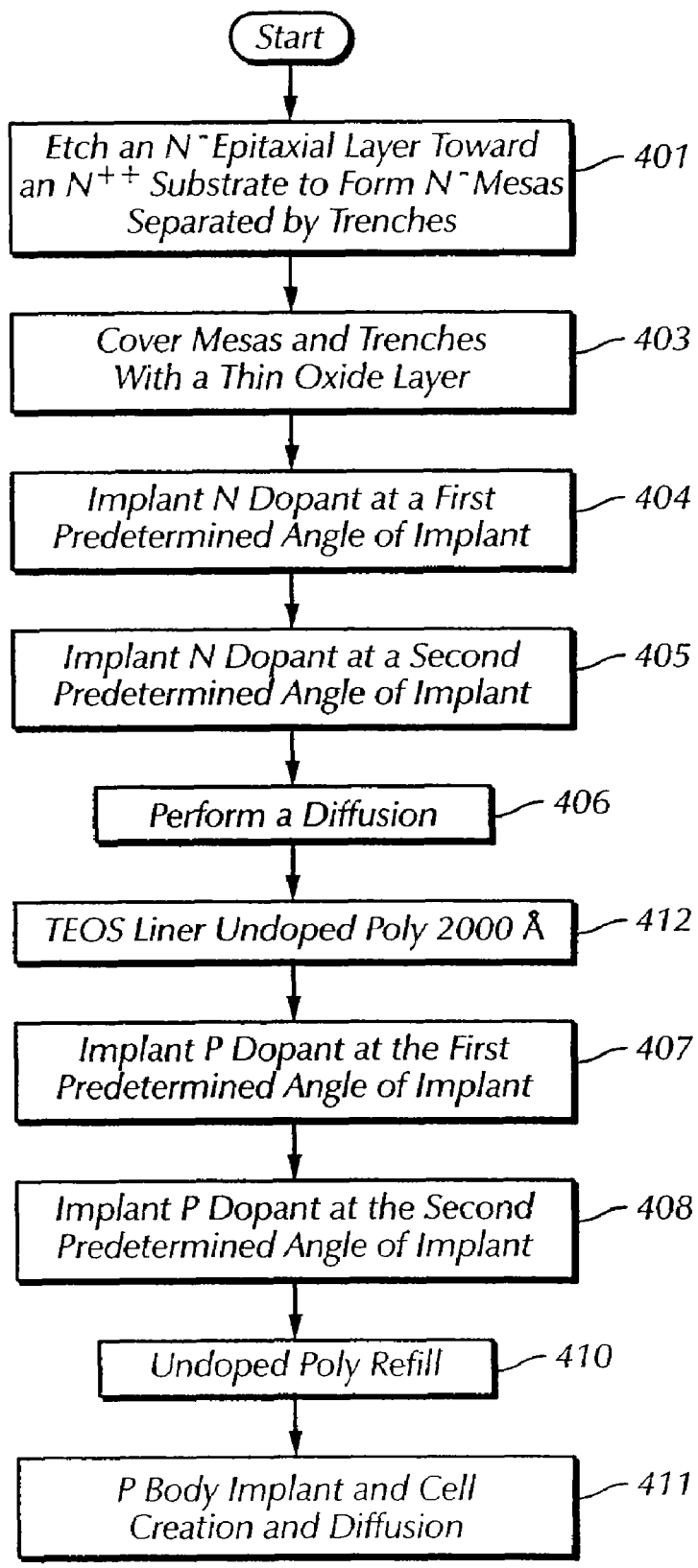
FIG. 20 is a flowchart demonstrating a process for manufacturing an N type structure in accordance with the second preferred embodiment of the present invention.
Figure 21:
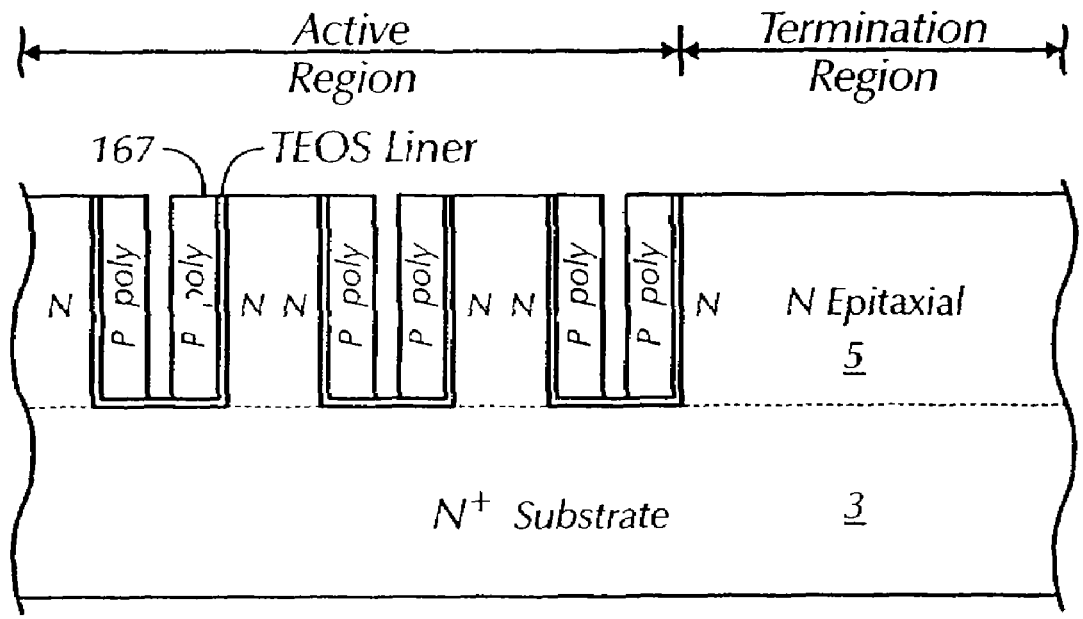
FIG. 21 is a partial sectional elevational view of an N type semiconductor substrate of FIG. 19 after a Tetraethylorthosilicate (TEOS) liner has been applied.

Proceeding to a third preferred embodiment of the wide mesa structure, FIGS. 19-21 generally show a process for manufacturing an N type structure in accordance with the third preferred embodiment of the present invention. Thus, the third preferred embodiment is an N type structure with oxide between N columns and P columns FIG. 19 illustrates the third embodiment N type structure where there is a thin or narrow 2P poly filled trenches 163 and a wider N column 161 having an oxide layer 165 that separates the N columns 161 from the 2P poly filled trenches 163, where oxide refers to silicon dioxide. The silicon dioxide layer 165 also separates the N termination region 31 from the 2P poly filled trenches 163.

The process used to manufacture the device of FIG. 19 is shown in the flowchart FIG. 20, where at step 401, there is an etch formed in N epitaxial layer 5 that approaches the N++ substrate 3 to form the N mesas 161 that are separated by trenches as was shown in the first embodiment. At step 403 the mesas 161, trenches, sides, bottoms and tops are covered with a thin oxide layer as was previously discussed with respect to the other embodiments. Thereafter, N type dopant is implanted at a first predetermined angle of implant Φ at step 404. Proceeding to step 405, the other side of the columns 161 are implanted with the N type dopant at the second predetermined angle of implant Φ'. Thereafter, a diffusion is performed at step 405 to diffuse the N type dopant into the N columns 161. At this point there is a TEOS liner 167 deposited (FIG. 21) in which P dopants will be implanted as shown in FIG. 20 wherein the TEOS liner of undoped poly of about 2000 Angstroms is performed at 412. Following the lining of the trenches, sidewalls, bottoms and tops of columns 161, a P type dopant is implanted at the first predetermined angle of implant Φ at step 407 following which the other side of the columns 161 are implanted with a P type dopant at step 408 at the second predetermined angle of implant Φ'. Thereafter, an undoped poly refill is performed at step 410. At step 411, a diffusion is performed after which the P body implant and cell creation is performed, additionally the rings 16 and 18 of FIG. 19 are created at this point.

One advantage of the third preferred embodiment is that following the undoped poly refill operation and the creation of a P body implant and diffusion, a cell remains separated by a thin oxide layer 165 (FIG. 19).

In the third preferred embodiment, for a P-channel device, the substrate is P+ and for an N-channel device the substrate is N+. The refill material can be doped or undoped oxide, nitride, semi-insulating material, polysilicon (poly) or other combinations. The resulting structure can be used to make MOSFETS and Schottky diodes and similar devices.

Figure 22:
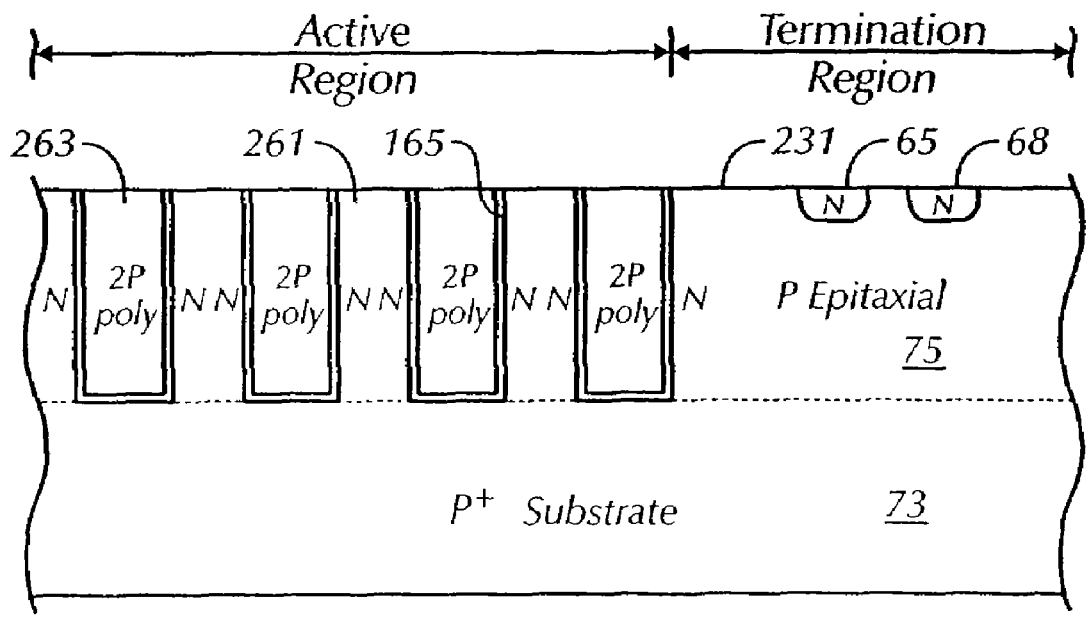
FIG. 22 is a partial sectional elevational view of a P type semiconductor substrate in accordance with an alternate of the third preferred embodiment of the present invention.
Figure 23:
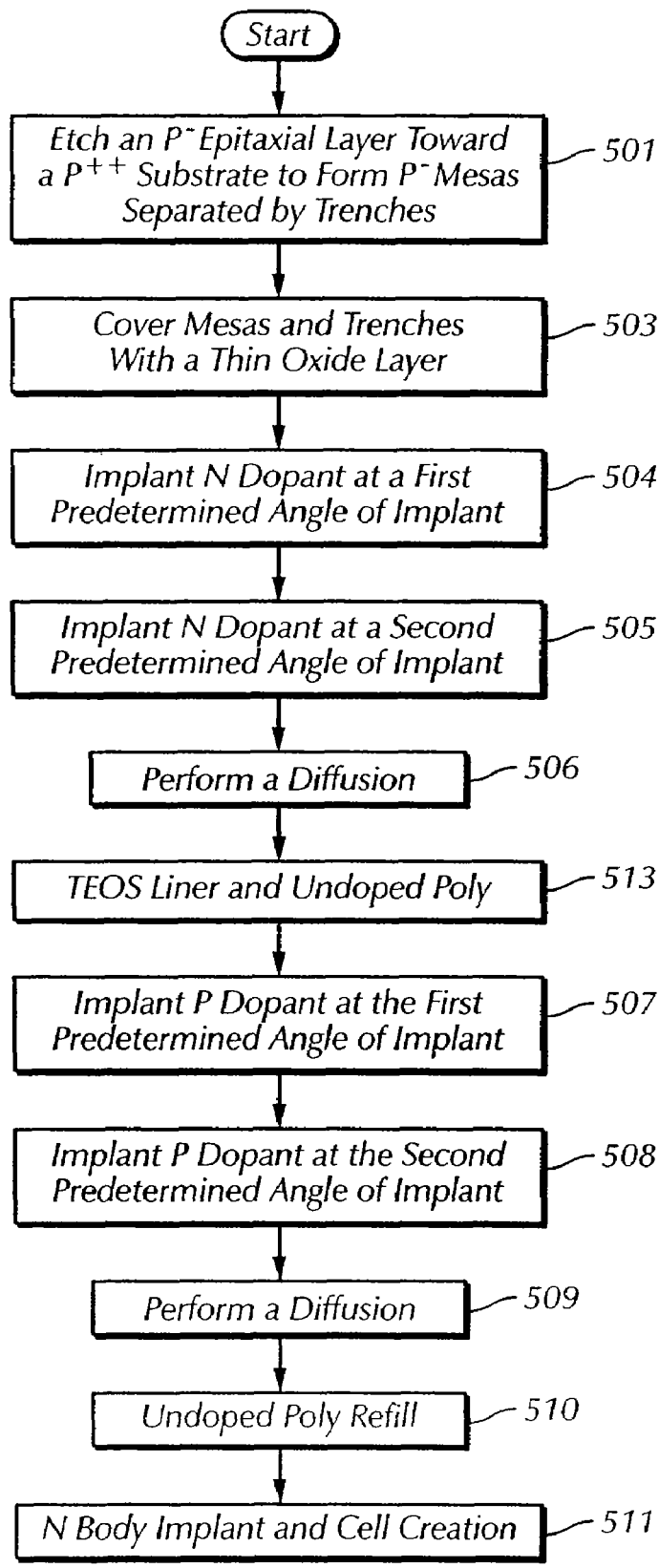
FIG. 23 is a flowchart demonstrating a process for manufacturing a P type structure in accordance with the alternate of the third preferred embodiment of the present invention.

FIGS. 22-23 generally show a process for manufacturing a P type structure in accordance with the third preferred embodiment of the present invention.

In the alternative of the third preferred embodiment, the N and P-channel columns can be exchanged. The refill material can be doped or undoped oxide, nitride, poly or other combinations. The P type structure, like the N type structure, can be used to make MOSFETS and Schottky devices and similar devices. As shown in FIG. 22, there are wide N columns 261 separated by a narrow 2P poly 263. The columns are separated by an oxide layer 165 which also separates the columns from the termination region 231. There are N regions, such as N rings 65 and 68, disposed in the termination region 231.

Referring to FIG. 23, at step 501, P− epitaxial layer 75 is etched toward the P+ substrate to form P mesas separated by trenches 9. At step 503, the mesas 261 are covered with a thin oxide layer 165. At step 504, the columns 261 are implanted with an N type dopant at the first predetermined angle of implant Φ. At step 505, there is an implant to the other side of the columns 261 with a second N type dopant at the second predetermined angle of implant Φ' that is the negative of the first predetermined angle of implant Φ. Following implantation of the dopants, a diffusion is performed at step 506. Proceeding to step 513, a TEOS liner of undoped poly is deposited on the device. Thereafter, the P dopant is implanted at the first predetermined angle of implant Φ, at step 507, and the other side of the structure is implanted at the second predetermined angle of implant Φ' at step 508. Then a diffusion is performed at step 509, and the undoped poly 263 is refilled at step 510. Diffusion is performed at step 511 where the N body implant and cell creation steps are executed at step 511.

Figure 24:
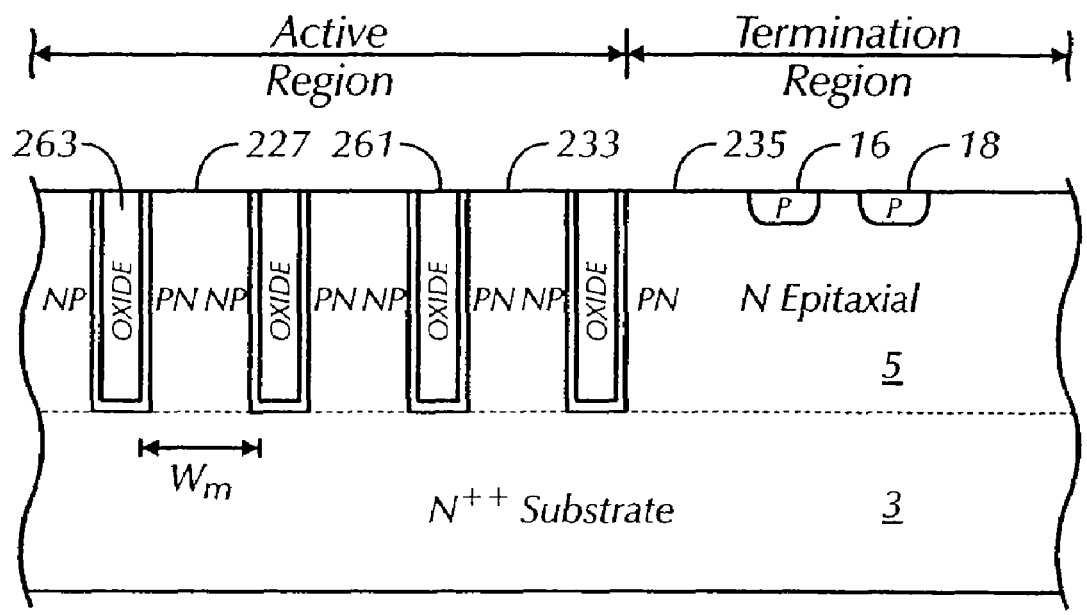
FIG. 24 is a partial sectional elevational view of an N type semiconductor substrate in accordance with a fourth preferred embodiment of the present invention.
Figure 26:
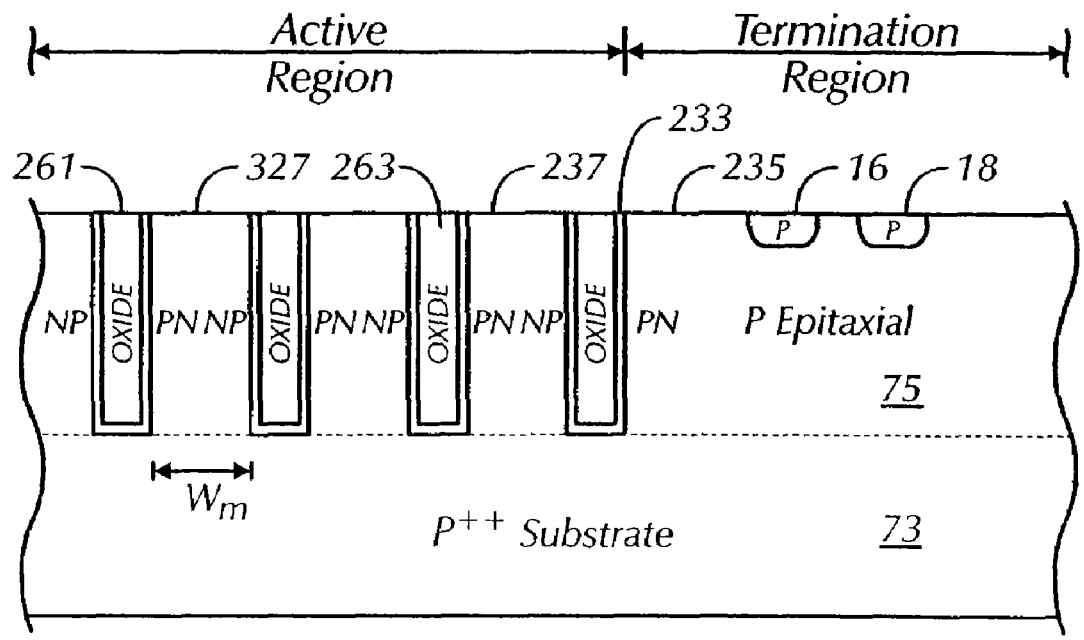
FIG. 26 is a partial sectional elevational view of a P type semiconductor substrate in accordance with an alternate of the fourth preferred embodiment of the present invention.
Figure 25:
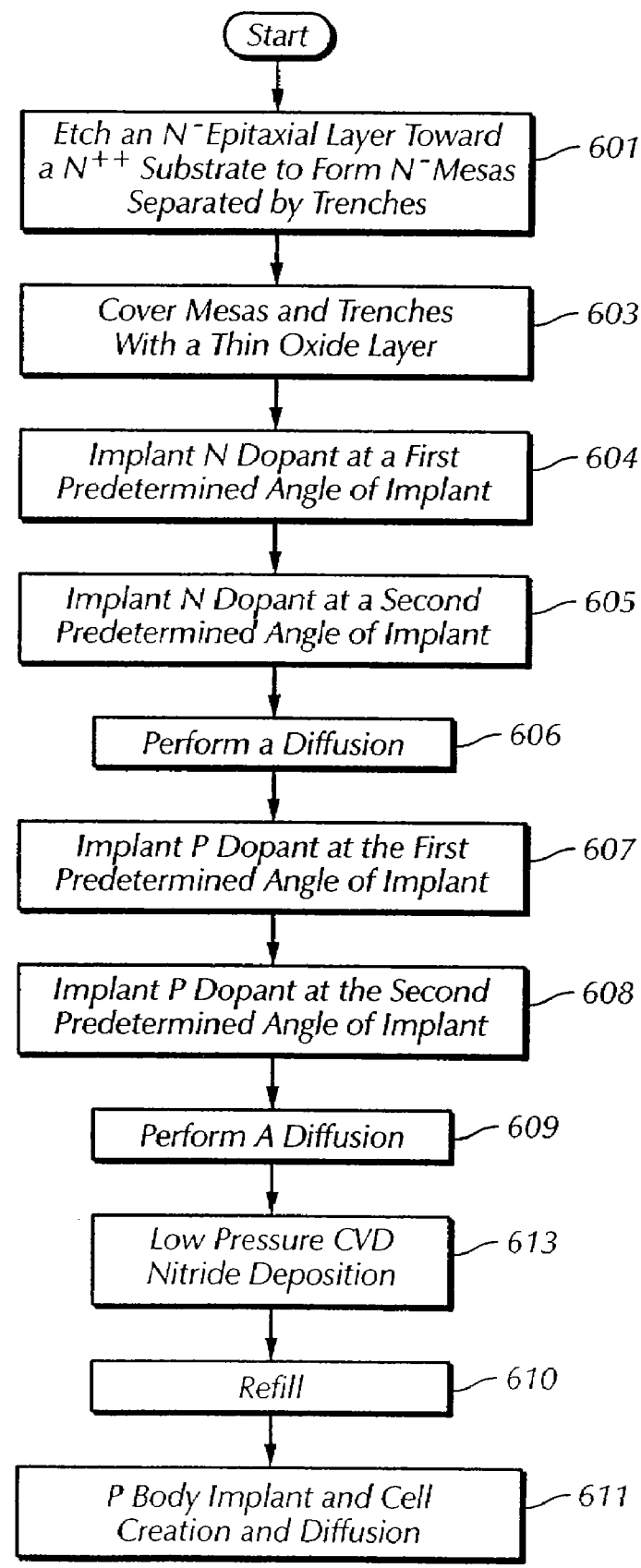
FIG. 25 is a flowchart demonstrating a process for manufacturing an N type structure in accordance with the second preferred embodiment of the present invention.

FIGS. 24-26 generally show a process for manufacturing a structure in accordance with a fourth preferred embodiment of the present invention. As with the previous embodiments, the N columns and P columns can be exchanged for P-channel devices the substrate is P+; for N-channel devices the substrate is N+. The refill material can be doped or undoped oxide, nitride, semi-insulating material, undoped poly or other combinations and the structure can be used to make MOSFETS and Schottky diodes and similar devices.

Referring to FIG. 24 there is shown a fourth embodiment showing an N type structure with dielectric refill 261. The structure includes wide columns 227 separated by dielectric area 261 which also separates the N termination region 235 from the wide columns 227. Additionally, there is a thin nitride layer 233 in place to prevent the dielectric refill area 261 from warping a chip formed from the structure during subsequent manufacturing.

The flowchart of FIG. 25 illustrates the processes used to manufacture this device and begins with trench etch as was previously discussed with the other devices at step 601. At step 603, the mesas 227 and trenches 261 are covered with a thin nitride layer 233. At step 604, an N type dopant is implanted at the first predetermined angle of implant Φ. At step 605, a second implant of the N type dopant is made at the second predetermined angle of implant Φ' that is the negative of the first predetermined angle of implant Φ. At step 606, a diffusion is performed to drive in the implanted N dopants. After the diffusion at step 606, the process proceeds to step 607 where a P dopant is implanted at the first predetermined angle of implant Φ after which the P type dopant is implanted at the second predetermined angle of implant Φ' at step 608. A diffusion step is performed at step 609 to diffuse the P type dopant and then at step 613 a low pressure chemical vapor deposition (LPCVD) of nitride is performed. After the nitride is in place, the trenches 261 are refilled at step 610 with a material 263 such as undoped oxide, nitride, polysilicon or other combination. At step 611, the P body implants are performed including the P rings 16 and 18.

FIG. 26 shows the P type structure of the fourth preferred embodiment with the dielectric refill material 263, wide columns 327 and a nitride layer 237. The refill material 263 may be doped or undoped oxide, nitride, semi-insulating material, undoped polysilicon or other combination and. The steps used to manufacture the P type structure of the fourth embodiment are generally the same as those used to manufacture the N type structure, except that the etch step is naturally performed on the P epitaxial layer 75. N type termination or isolation rings 16 and 18 are disposed in the P epitaxial layer 75.

FIGS. 27-31 are planar MOSFETS cell descriptions (i.e., configurations of individual devices or cells of a single-cell or multi-cell chip) using a standard planar process N type structure.

Figure 27:
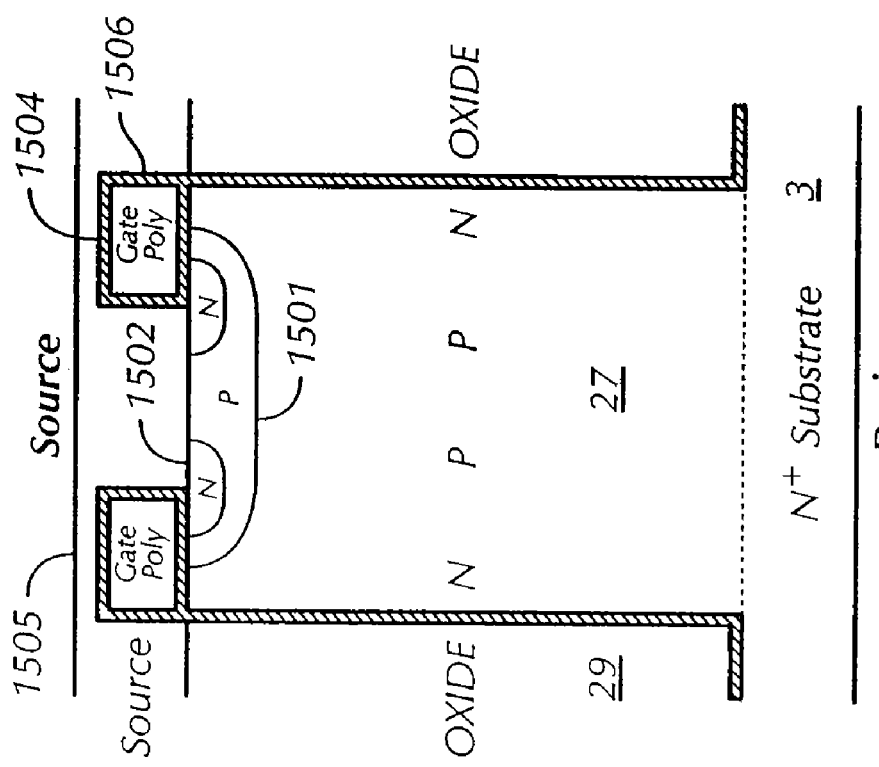
FIG. 27 is a partial sectional elevational view of a cell description of a planar metal-oxide semiconductor field effect transistor (MOSFET) N type structure using a standard planar process in accordance with the first preferred embodiment.

FIG. 27 shows an NP-PN mesa device in accordance with the first preferred embodiment having an NP-PN column 27 that is isolated from other neighboring cells by the dielectric refill 29 and there is a source region 1505 which includes a P region 1501 in which there is formed N source region 1502. There is an oxide layer 1506 that separates the gate poly 1504 from the N source connector 1502 and the P region 1501. A source connector is generally 1505.

Figure 28:
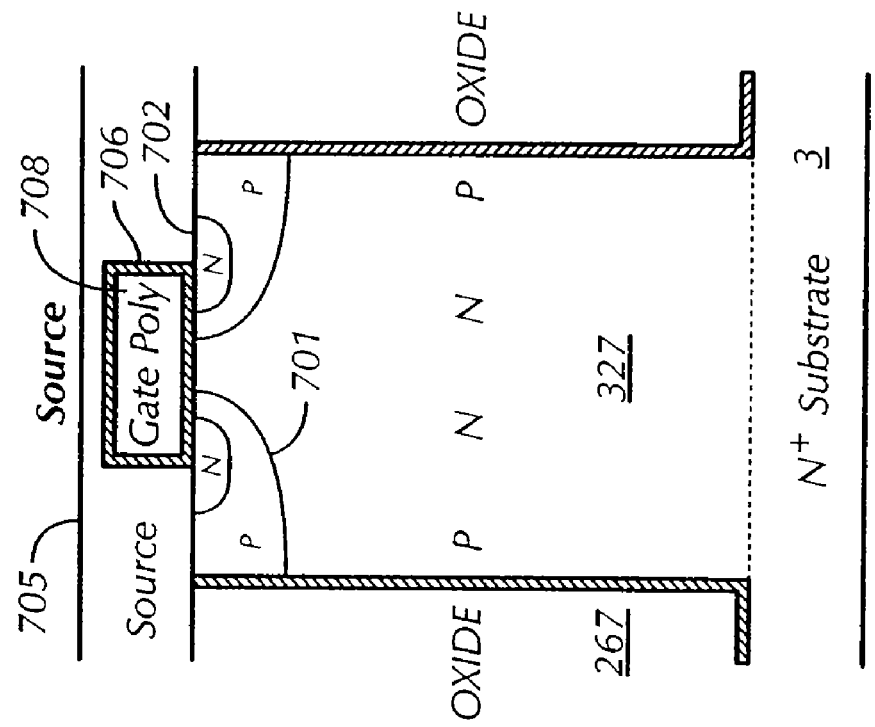
FIG. 28 is a partial sectional elevational view of a cell description of a planar metal-oxide semiconductor field effect transistor (MOSFET) N type structure using a standard planar process in accordance with the fourth preferred embodiment.

FIG. 28 shows a PN-NP mesa device in accordance with the fourth preferred embodiment which is used in the N type planar MOS structure. The device has a PN-NP column 327 that is isolated by other neighboring cells by the dielectric 261. A source 705 includes a P region 701 in which an N type source connection 702 is located. An oxide layer 706 separates the gate poly 708 from the N source region 702 and the P region 701.

Figures 29, 30:
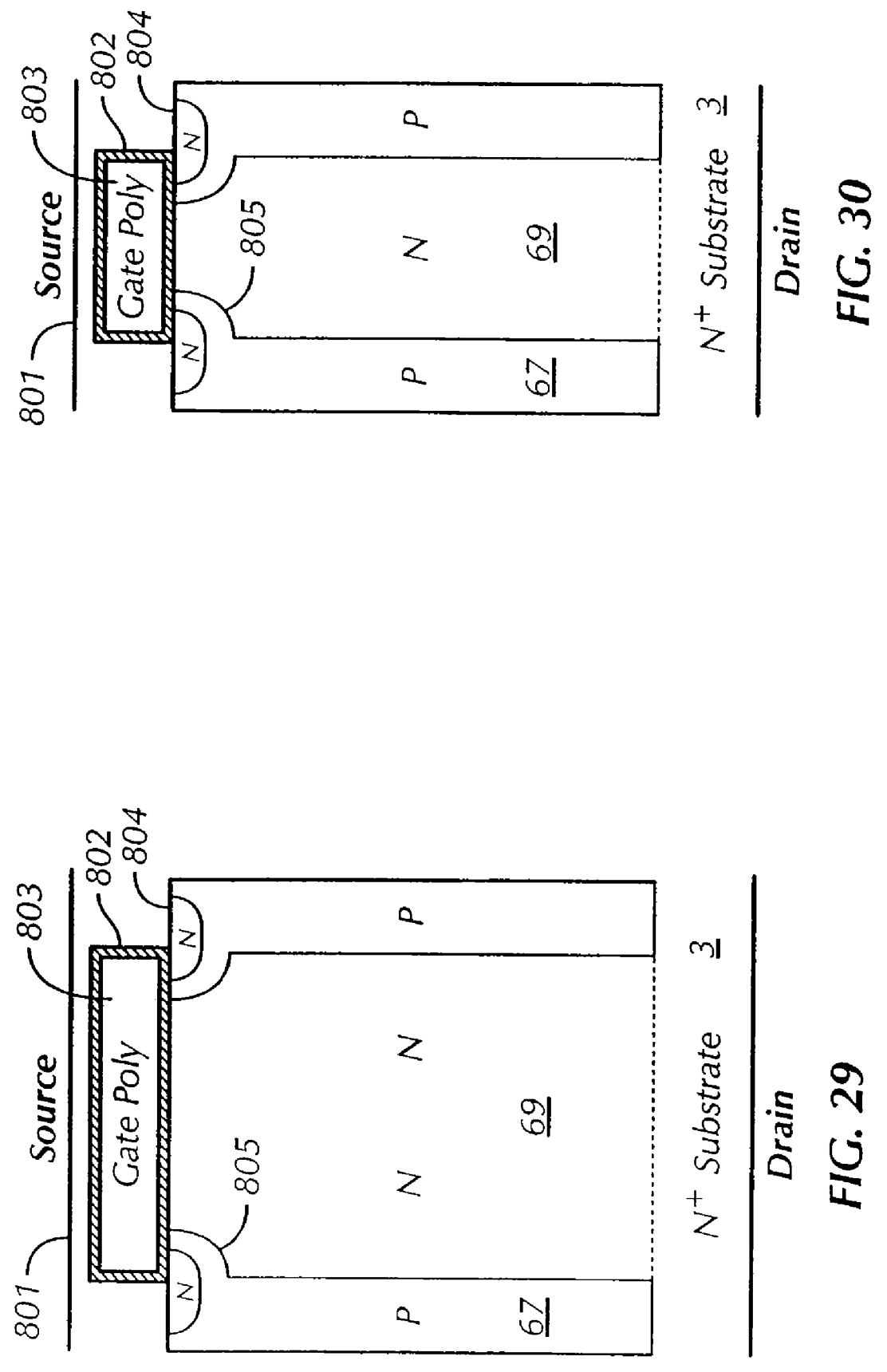

FIG. 29 shows a PNP mesa device in accordance with the second preferred embodiment using an N type planar MOS device. The device includes an NN region 69 that is isolated from other neighboring cells by the P poly region 67. There is a deep P region 805 in which N source regions 804 are situated. The gate poly 803 is surrounded by an oxide layer 802 which is all part of the source region 801. A similar structure is provided in FIG. 30 which is a narrow pitch version of the device of FIG. 29 and has the same structure except for the width of the N region 69.

Figure 31:
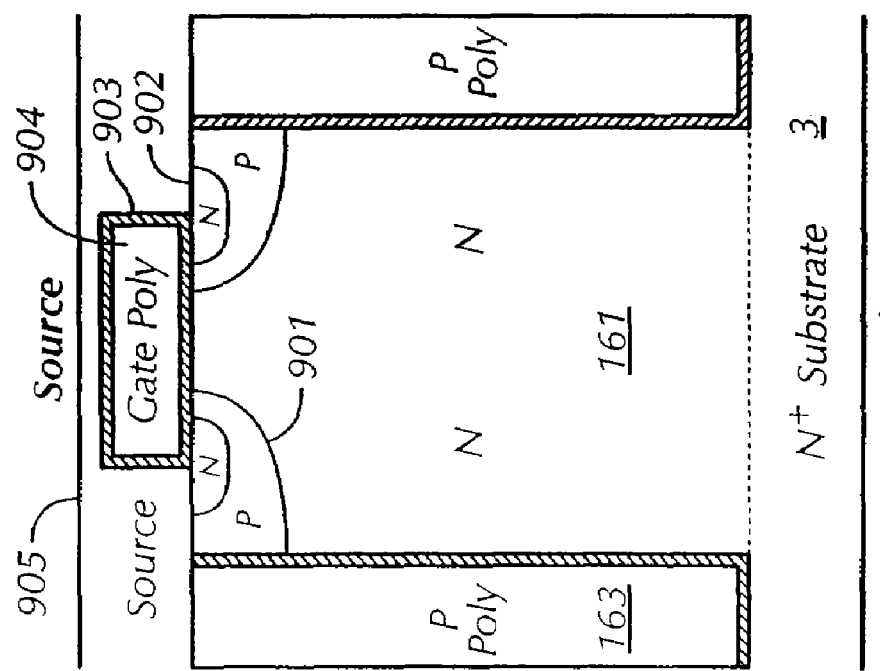
FIG. 31 is a partial sectional elevational view of a cell description of a planar metal-oxide semiconductor field effect transistor (MOSFET) N type structure using a standard planar process in accordance with the third preferred embodiment.

FIG. 31 shows a PNP mesa device in accordance with the third preferred embodiment of the N type planar MOSFET structure. The device includes an NN region 161 is isolated from other neighboring cells by the P poly regions 163. A source regions 905 includes a gate poly region 904 which is surrounded by an oxide layer 903 the source connections include an N region 902 which is located within a P region 901.

FIGS. 32-36 are planar MOSFET cellular descriptions (i.e., configurations of individual devices or cells of a single-cell or multi-cell chip) using the standard planar process for P type structures.

Figure 32:
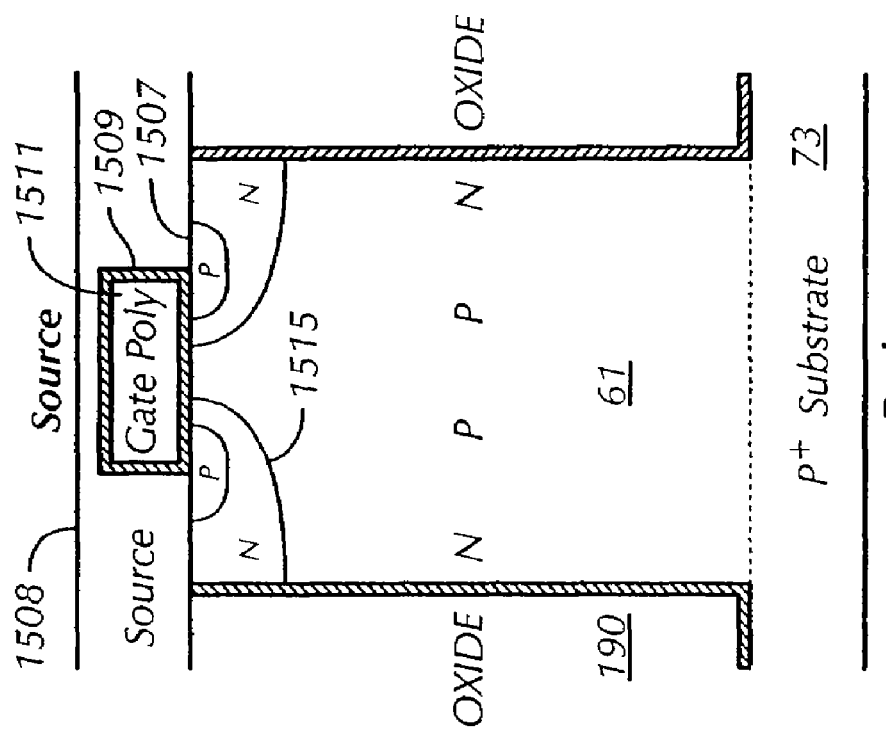
FIG. 32 is a partial sectional elevational view of a cell description of a planar metal-oxide semiconductor field effect transistor (MOSFET) P type structure using a standard planar process in accordance with the first preferred embodiment.

FIG. 32 shows an NP-PN mesa device formed in accordance with the first preferred embodiment. P substrate 73, which is a drain, is disposed on an NP-PN column 61. The device is isolated from other neighboring cellular structures by the dielectric layer 190. A source region 1508 includes an N region 1515 in which the P source connection 1507 are located. The gate poly 1511 is positioned over both the N region 1505 and source P regions 1507 and is isolated therefrom by an oxide layer 1509.

Figure 33:
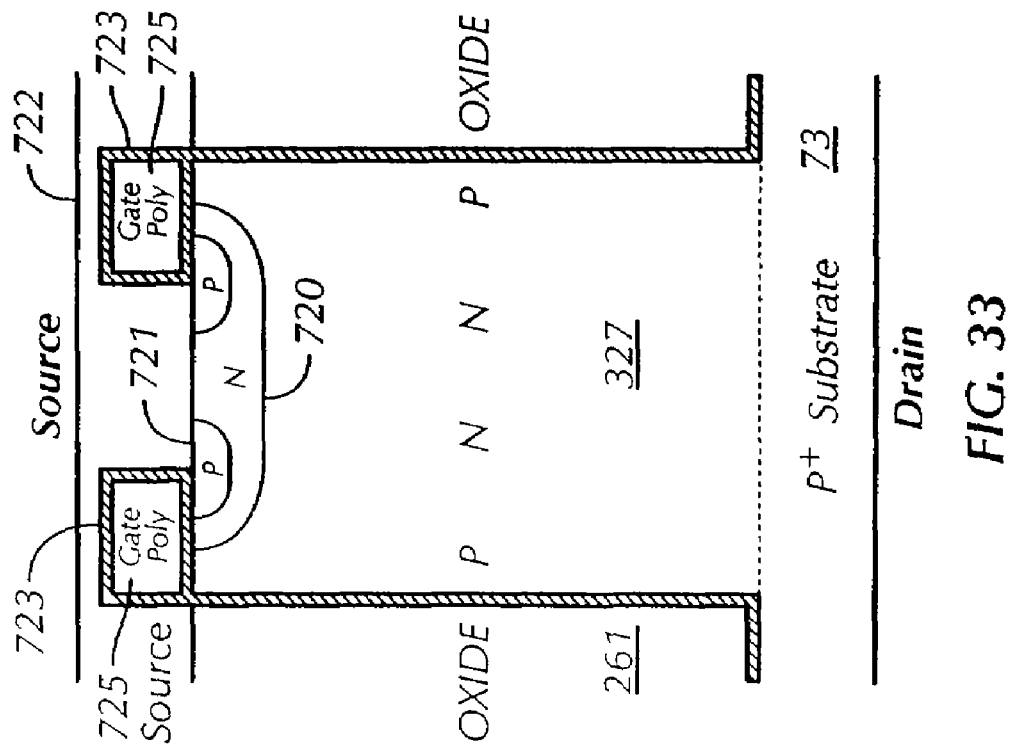
FIG. 33 is a partial sectional elevational view of a cell description of a planar metal-oxide semiconductor field effect transistor (MOSFET) P type structure using a standard planar process in accordance with the fourth preferred embodiment.

FIG. 33 is a PN-NP mesa device formed in accordance with the fourth preferred embodiment using P type planar MOSFET structure. The device includes a $P^+$ type substrate 73, which is a drain, and on which the PN-NP column 327 is disposed. The device is isolated from the neighboring cells by dielectric region 261. There is a source region 722 which includes an N region 720 in which the source P connections 721 are situated. There are two (2) gates and each gate includes a gate oxide 723 which surrounds the gate poly 725.

Figure 34:
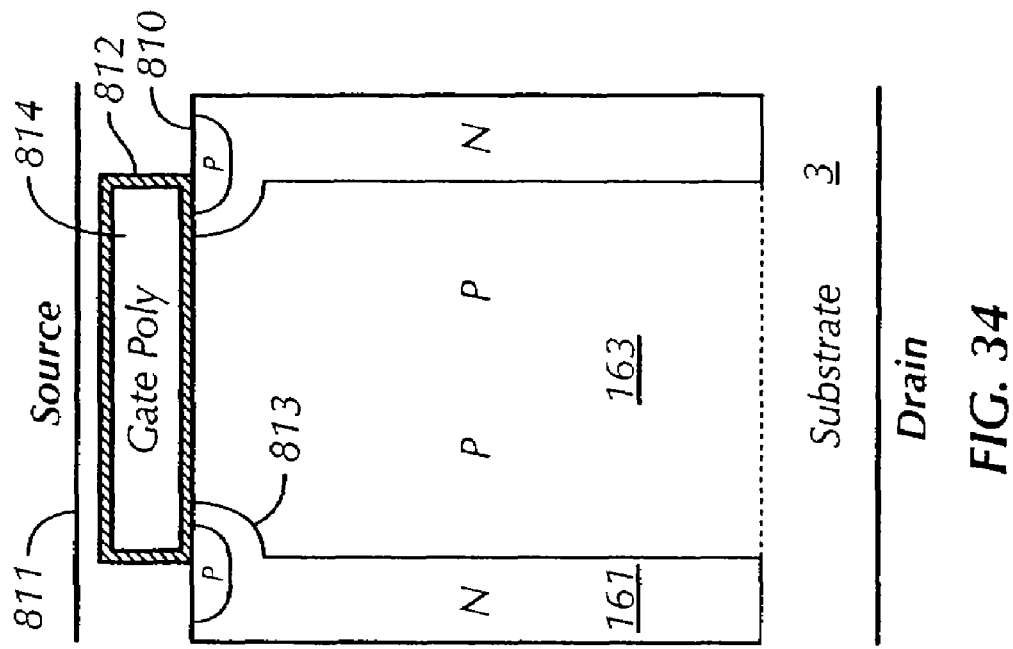
FIG. 34 is a partial sectional elevational view of a cell description of a planar metal-oxide semiconductor field effect transistor (MOSFET) P type structure using a standard planar process in accordance with the second preferred embodiment.
Figure 35:
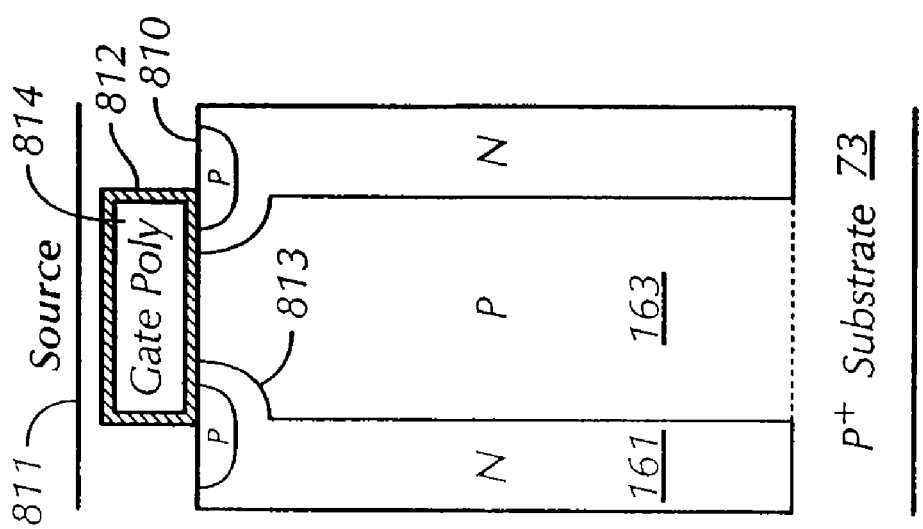
FIG. 35 is a partial sectional elevational view of a cell description of a planar metal-oxide semiconductor field effect transistor (MOSFET) P type structure using a standard planar process having a narrow pitch in accordance with the second preferred embodiment.

FIGS. 34-35 show a device formed in accordance with the second preferred embodiment, where FIG. 34 shows the wide structure and FIG. 35 shows the narrow structure. The N substrate 73 includes a PP column 163 (wide mesa) or P column 163 (narrow mesa) with N type material 161 isolating it from neighboring cells. Source region 811 includes an N region 813 in which the P source connections 810 are located. The gate includes an oxide layer 812 that surrounds the gate poly 814.

Figure 36:
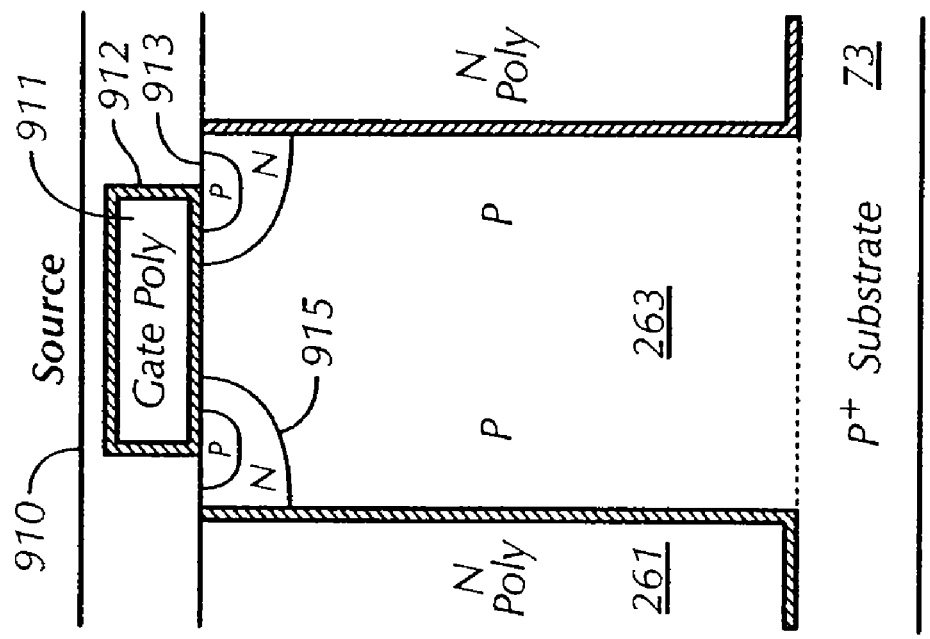
FIG. 36 is a partial sectional elevational view of a cell description of a planar metal-oxide semiconductor field effect transistor (MOSFET) P type structure using a standard planar process in accordance with the third preferred embodiment.

FIG. 36 show a device formed in accordance with the third preferred embodiment having an PP type mesa using the P type planar MOS structure and includes a $P^+$ substrate 73 on which there is a PP column 263 that is isolated from neighboring cells by an N poly 261. A source region 910 includes an N region 915 in which P connections are situated 913. Connecting the regions the PP column 263 with the source 213 is the gate which includes the gate poly regions 914 that is surrounded by a gate oxide layer 912.

FIGS. 37-41 are cell descriptions (i.e., configurations of individual devices or cells of a single-cell or multi-cell chip) of trench MOSFETs of the standard trench process N type.

Figure 37:
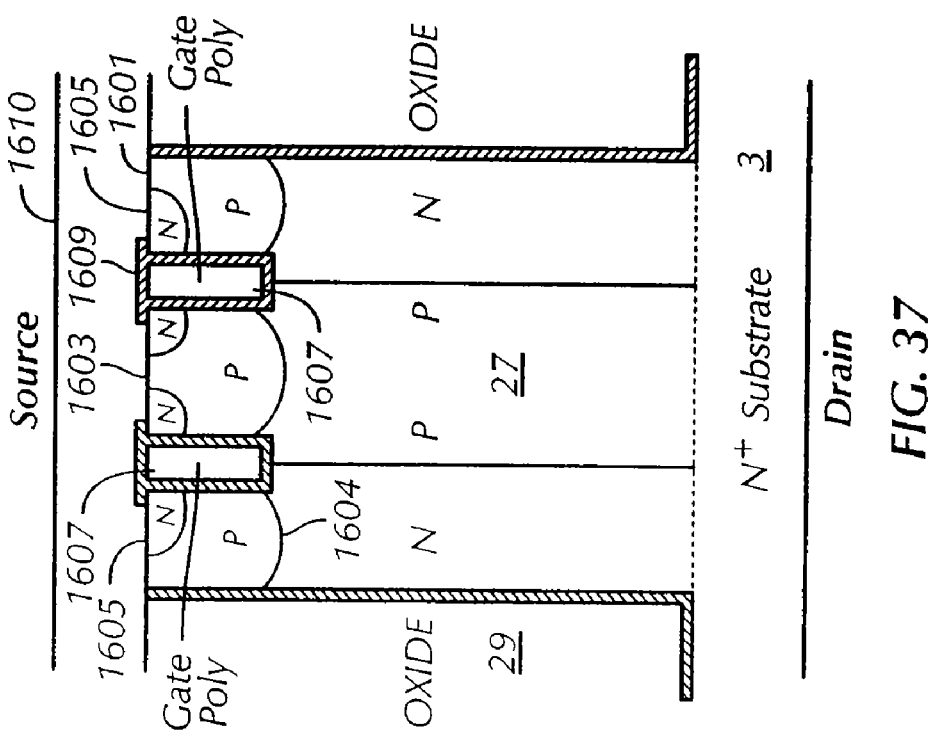
FIG. 37 is a partial sectional elevational view of a cell description of a trench metal-oxide semiconductor field effect transistor (MOSFET) N type structure using a standard trench process in accordance with the first preferred embodiment.

FIG. 37 shows a cellular structure of a device in accordance with the first preferred embodiment using an NP-PN mesa. An NP-PN column 27 is located on the substrate 3 which is the drain and which is isolated from other neighboring cells by poly region 29. There are three (3) P regions 1601, 1603, 1604 separated from each other by a trench that includes a gate poly regions 1607 that are surrounded by an oxide layer 1609. The N source connections 1605 are situated within the P regions 1601, 1603, 1604 and are separated from the gate poly 1607 by the oxide layer 1609 to create the source region 1610.

Figure 38:
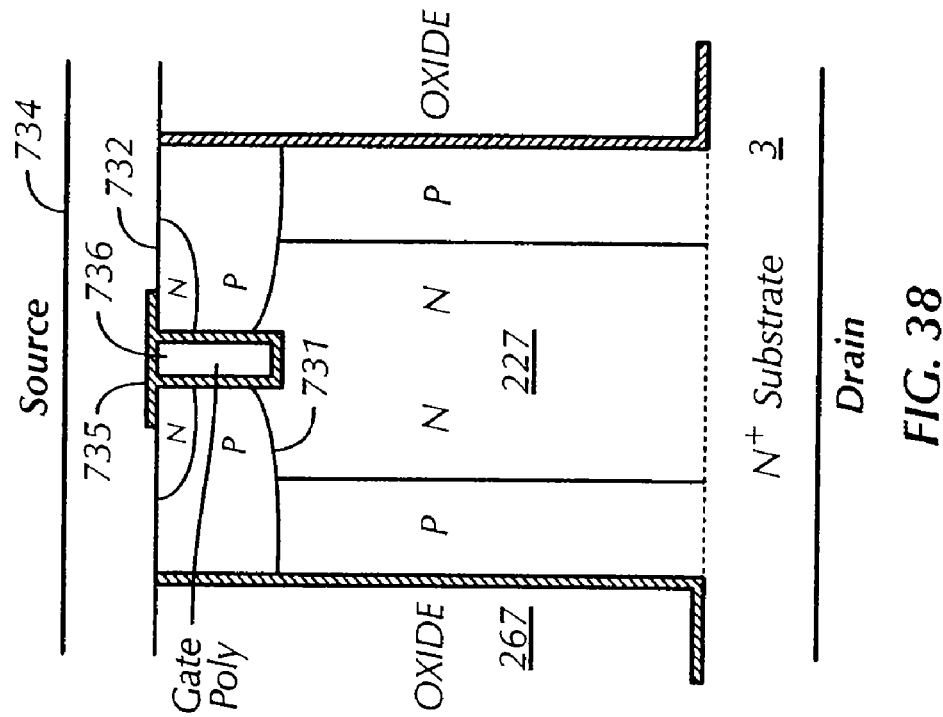
FIG. 38 is a partial sectional elevational view of a cell description of a trench metal-oxide semiconductor field effect transistor (MOSFET) N type structure using a standard trench process in accordance with the fourth preferred embodiment.

FIG. 38 shows a cellular structure of a device in accordance with the fourth preferred embodiment using a PN-NP mesa. The device includes the PN-NP column 227 which is isolated from the other neighboring cellular structures by poly regions 267. A source region 734 includes a P region 731 and an N source connection 732, situated within the P region 731. The P region 731 and N source connection 732 are isolated from the gate poly 736 by an oxide layer 735.

FIGS. 39-40 show cellular structures in accordance with the second preferred embodiment having wide (FIG. 39) and narrow (FIG. 40) PN-NP mesas. The devices each include an NN region 69 which is isolated from the neighboring cells by a poly region 67, the $N^+$ substrate 3 is the drain, and a source region 823 includes a P region 221 in which the N source connection 822 is located. The N source connection 822 is insulated from the gate poly 825 by an oxide layer 824.

Figure 41:
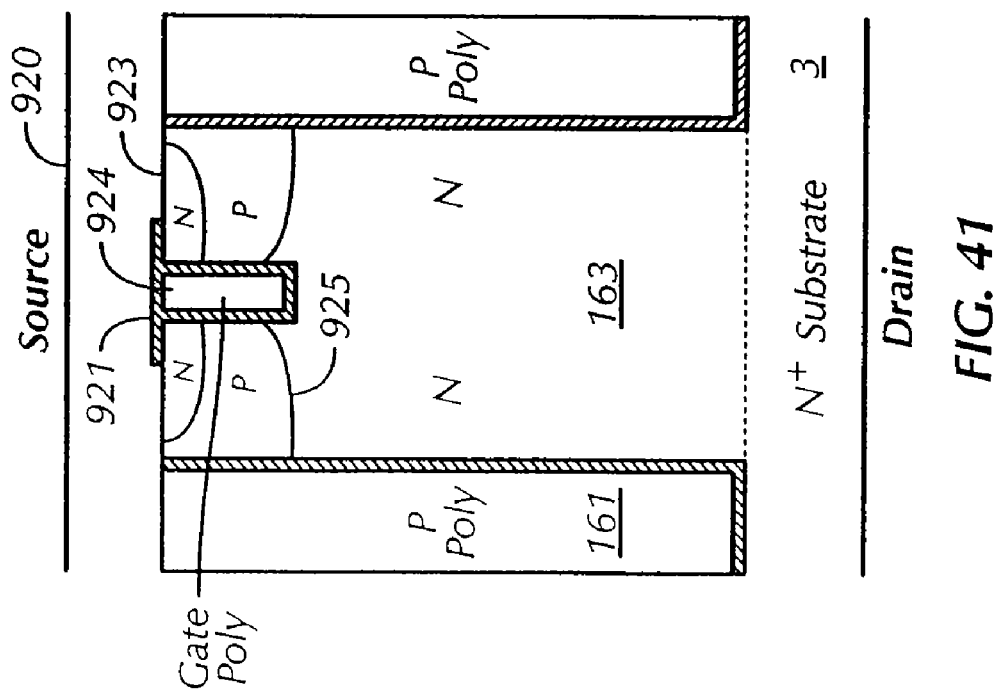
FIG. 41 is a partial sectional elevational view of a cell description of a trench metal-oxide semiconductor field effect transistor (MOSFET) N type structure using a standard trench process in accordance with the third preferred embodiment.

FIG. 41 shows a cellular structure of a device in accordance with the third preferred embodiment having a PN-NP mesa. The device includes an NN column 163 mounted on the substrate 3 which is a drain, and the device is isolated from the other neighboring cells by P poly region 161. A source 920 includes a P region 925 in which the N source connections 923 are situated. The N source connections 923 and P regions are insulated from the gate poly 924 by an oxide layer 921.

FIGS. 42-46 are cell descriptions (i.e., configurations of individual devices or cells of a single-cell or multi-cell chip) of a standard trench MOSFET process using a P type structure.

Figure 42:
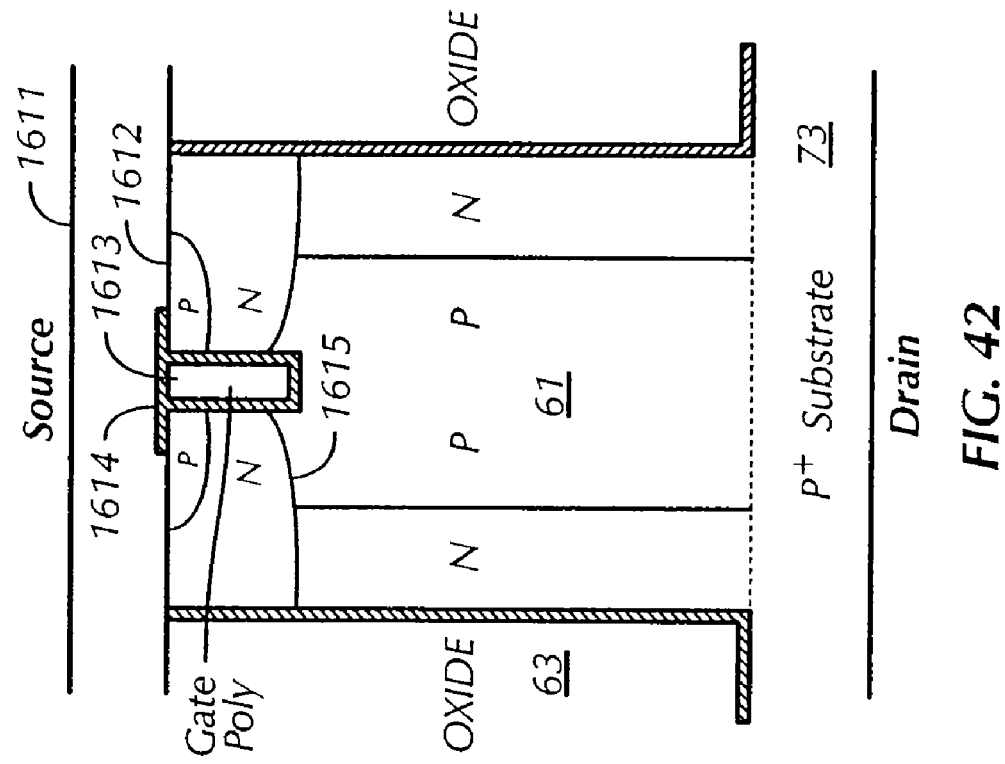
FIG. 42 is a partial sectional elevational view of a cell description of a trench metal-oxide semiconductor field effect transistor (MOSFET) P type structure using a standard trench process in accordance with the first preferred embodiment.

FIG. 42 shows a cellular structure of a device in accordance with the first preferred embodiment having an NP-PN mesa for a P type trench MOSFET. The device includes an NP-PN column 61 disposed on the P⁺ substrate 73 which is the drain. The device is isolated from the other neighboring cells by the dielectric region 63. A source region 1611 includes an N region 1615 in which a P source contact 1612 is situated. There is a gate poly 1613 that is surrounded by a gate oxide layer 1614.

Figure 43:
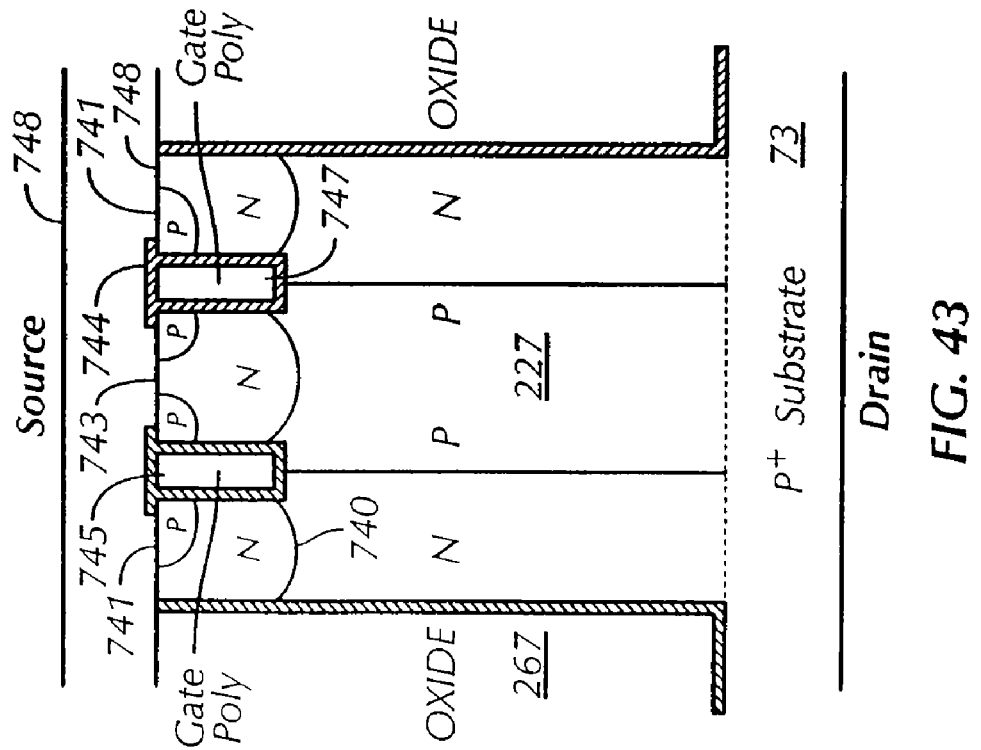
FIG. 43 is a partial sectional elevational view of a cell description of a trench metal-oxide semiconductor field effect transistor (MOSFET) P type structure using a standard trench process in accordance with the fourth preferred embodiment.

FIG. 43 shows a cellular structure of a device in accordance with the fourth preferred embodiment having an NP-PN mesa for a P type trench MOSFET. The device includes the P substrate 73, which is the drain, on which the NP-PN column 227 is located. A dielectric layer 267 separates the device from other neighboring cells. The device includes a source region 750 having three (3) N regions 740, 743 and 748. The N regions 740, 743 and 748 include P source regions 741 situated therein. The N regions 740, 743, 748 and P source regions 741 are isolated from gate poly regions 745, 747 by oxide layers 744.

Figure 44:
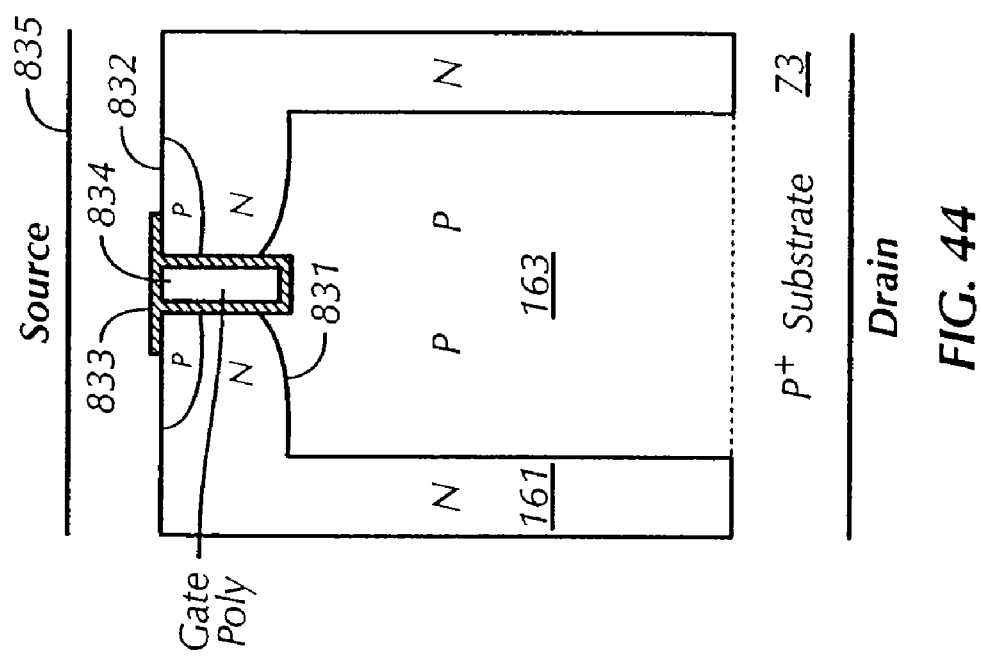
FIG. 44 is a partial sectional elevational view of a cell description of a trench metal-oxide semiconductor field effect transistor (MOSFET) P type structure using a standard trench process in accordance with the second preferred embodiment.

FIG. 44 shows a cellular structure of a device in accordance with the second preferred embodiment having an NP-PN mesa for a P type trench MOSFET. The device includes a P substrate 73, which is the drain, on which there is a PP column 163 that is isolated from the other neighboring cell structures by N regions 161. A source region 835 includes an N region 831 in which a P region 832 is situated. The P region 832 serves as a P source contact and is isolated from the gate poly 834 by an oxide layer 833. A similar structure is provided in FIG. 45 which is a narrow pitch of the device of FIG. 44 and has the same structure except for the width of the P region 163.

Figure 46:
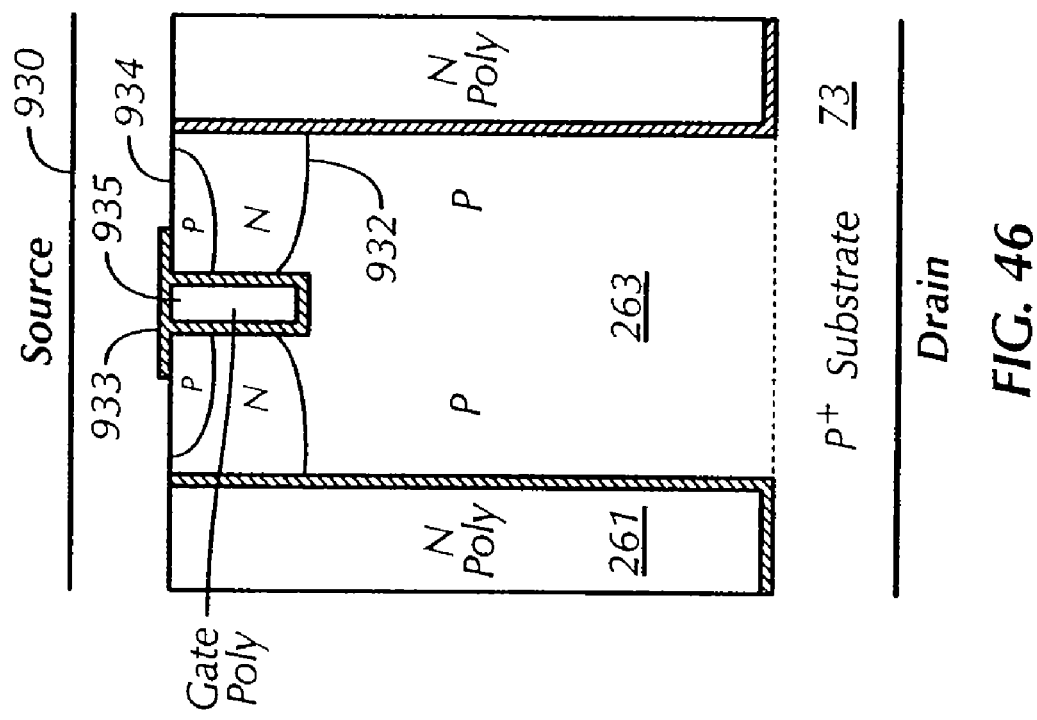
FIG. 46 is a partial sectional elevational view of a cell description of a trench metal-oxide semiconductor field effect transistor (MOSFET) P type structure using a standard planar process in accordance with the fourth preferred embodiment.
Figure 45:
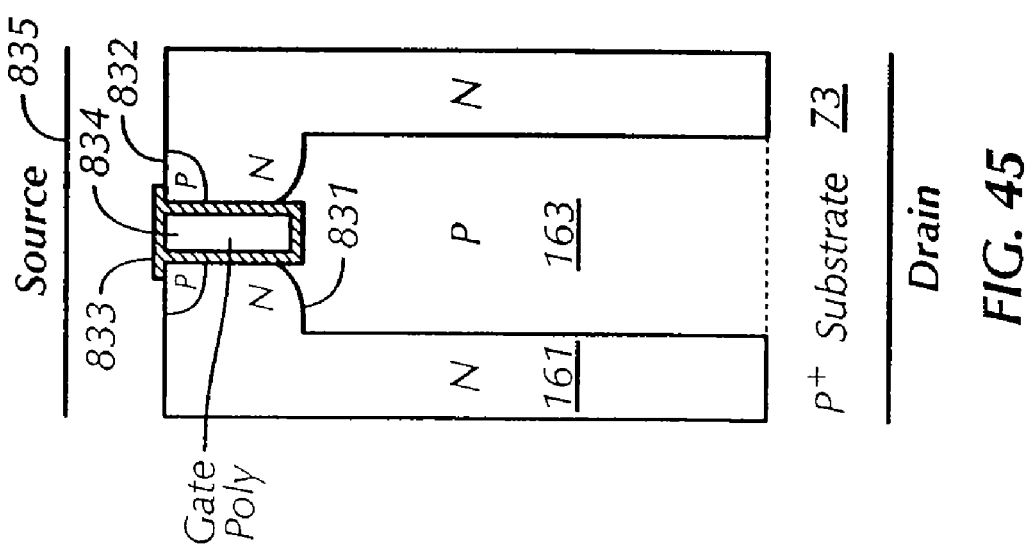
FIG. 45 is a partial sectional elevational view of a cell description of a trench metal-oxide semiconductor field effect transistor (MOSFET) P type structure using a standard trench process having a narrow pitch in accordance with the second preferred embodiment.

FIG. 46 shows a cellular structure of a device in accordance with the third preferred embodiment having an NP-PN mesa for a P type trench MOSFET. The device includes a P substrate 73, which is the drain, on which a PP column 263 is disposed. The device is separated from the other neighboring cells by an N poly 261. A source region 930 includes an N region 932 in which a P source contact 934 is situated. A gate poly 935 is separated from the P source contact 934 by an oxide layer 933.

Figure 47:
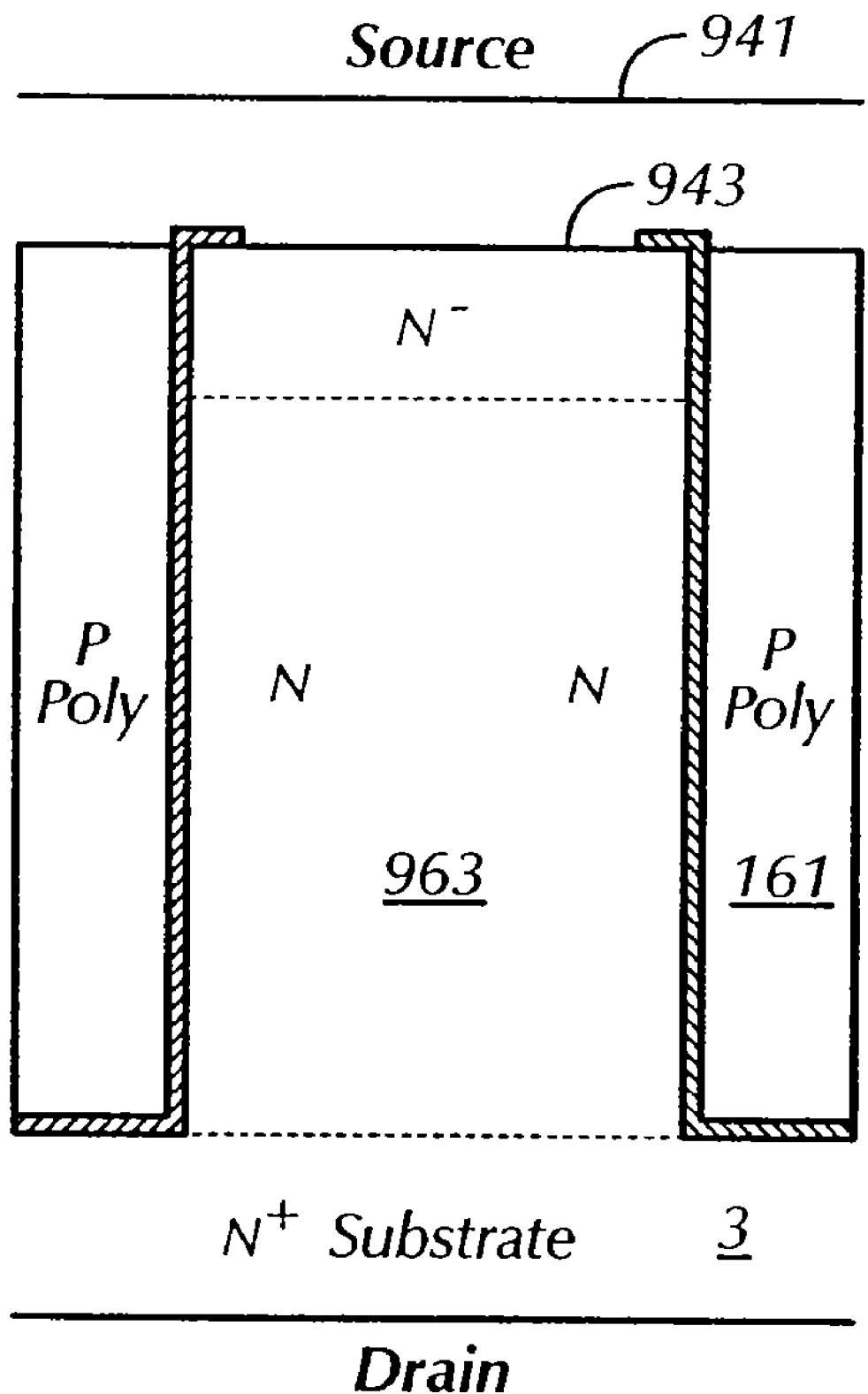
FIG. 47 is a partial sectional elevational view of a cell description of an N type planar Schottky diode device.

FIG. 47 shows a cell description of an N type planar Schottky diode device. FIG. 47 shows a planar Schottky device as a P implant for surface computation plus standard Schottky process on an N type substrate 3 which is the drain. A source 941 includes terminal 943 over an NN column 963 that is isolated from neighboring cells by a P poly layer 161.

As mentioned above, the processes are versatile as the N columns and P columns can be exchanged. For the manufacture of P-channel, devices the substrate is P⁺ and for N-channel devices the substrate is N⁺. The refill material can be doped or undoped oxide, semi-insulating material (such as SIPOS), doped or undoped polysilicon, nitride or a combination of materials. The different embodiments can be use to make MOSFETs and Schottky diodes and similar devices.

Finally the edge termination regions may include either floating rings or a field plate termination without departing from the invention.

From the foregoing, it can be seen that the present invention is directed to a semiconductor device and methods for manufacturing a method of manufacturing superjunction semiconductor devices having wide mesas. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method of manufacturing a semiconductor device comprising:
    providing a semiconductor substrate having first and second main surfaces opposite to each other, the semiconductor substrate having a heavily doped region of a first conductivity type at the second main surface and having a lightly doped region of the first conductivity type at the first main surface;
    forming in the semiconductor substrate a plurality of trenches and a plurality of mesas with each mesa having an adjoining trench and a first extending portion extending from the first main surface toward the heavily doped region to a first depth position, at least one mesa having a first sidewall surface and a second sidewall surface, each of the plurality of trenches having a bottom;
    doping with a dopant of a second conductivity type the first sidewall surface of the at least one mesa to form a first doped region of the second conductivity type;
    doping with the dopant of the second conductivity type the second sidewall surface of the at least one mesa to form a second doped region of the second conductivity type;
    doping with a dopant of the first conductivity type the first sidewall surface of the at least one mesa to provide a second doped region of the first conductivity type at the first sidewall, and doping with the dopant of the first conductivity type a second sidewall surface of the at least one mesa; and
    filling at least the trenches adjacent to the at least one mesa with one of a semi-insulating material and an insulating material.

2. The method according to claim 1, further comprising:
    prior to filling the trenches adjacent to the at least one mesa with an insulating material, depositing a layer of silicon nitride on the first and second sidewalls and the bottoms of the trenches.

3. The method according to claim 1, further comprising:
    prior to doping with the dopant of the second conductivity type the first sidewall surface of the at least one mesa, forming an oxide layer over the at least one mesa, first and second sidewalls and the bottoms of at least the trenches adjacent to the at least one mesa.

4. The method according to claim 1, further comprising:
    prior to doping with the dopant of the first conductivity type the first sidewall surface of the at least one mesa, depositing an epitaxial layer over the bottoms of at least the trenches adjacent to the at least one mesa and the at least one mesa including the first and second sidewalls.

5. The method according to claim 1, further comprising:
prior to doping with the dopant of the first conductivity type the first sidewall surface of the at least one mesa, forming a tetraethylorthosilicate (TEOS) liner over the bottoms of at least the trenches adjacent to the at least one mesa and the at least one mesa including the first and second sidewalls.

6. The method according to claim 5, further comprising:
forming a layer of undoped polysilicon over the bottoms of at least the trenches adjacent to the at least one mesa and the at least one mesa including the first and second sidewalls.

7. The method according to claim 6, wherein the step of filling at least the trenches adjacent to the at least one mesa with one of a semi-insulating material and an insulating material includes filling at least the trenches adjacent to the at least one mesa with at least one of undoped polysilicon, doped polysilicon, doped oxide, undoped oxide, silicon nitride and semi-insulating polycrystalline silicon (SIPOS).

8. The method according to claim 1, wherein the first sidewall surface has a first predetermined inclination angle maintained relative to the first main surface and the second sidewall surface has a second predetermined inclination angle maintained relative to the first main surface.

9. The method according to claim 1, wherein the first and second sidewall surfaces are generally perpendicular relative to the first main surface.

10. The method according to claim 1, wherein the plurality of trenches are formed by etching the semiconductor substrate.

11. A semiconductor device formed by the method of claim 1.

12. A method of manufacturing a semiconductor device comprising:
providing a semiconductor substrate having first and second main surfaces opposite to each other, the semiconductor substrate having a heavily doped region of a first conductivity type at the second main surface and having a lightly doped region of the first conductivity type at the first main surface;
forming in the semiconductor substrate a plurality of trenches and a plurality of mesas, with each mesa having an adjoining trench and a first extending portion extending from the first main surface toward the heavily doped region to a first depth position, at least one mesa having a first sidewall surface and a second sidewall surface, each of the plurality of trenches having a bottom;
doping with a dopant of a first conductivity type the first sidewall surface of the at least one mesa to form a first doped region of the first conductivity type;
doping with the dopant of the first conductivity type the second sidewall surface of the at least one mesa to form a second doped region of the first conductivity type;
doping with a dopant of the second conductivity type a first sidewall surface of the at least one mesa to provide a second doped region of the first conductivity type at the first sidewall, doping with the dopant of the second conductivity type the second sidewall surface of the at least one mesa; and
filling at least the trenches adjacent to the at least one mesa with one of a semi-insulating material and an insulating material.

13. The method according to claim 12, further comprising:
prior to filling at least the trenches adjacent to the at least one mesa with one of a semi-insulating material and an insulating material, depositing a layer of silicon nitride on the first and second sidewalls and the bottoms of the trenches.

14. The method according to claim 12, further comprising:
prior to doping with the dopant of the first conductivity type the first sidewall surface of the at least one mesa, forming an oxide layer over the bottoms of at least the trenches adjacent to the at least one mesa and the at least one mesa including the first and second sidewalls.

15. The method according to claim 12, further comprising:
prior to doping with the dopant of the second conductivity type the first sidewall surface of the at least one mesa, depositing an epitaxial layer over the bottoms of at least the trenches adjacent to the at least one mesa and the at least one mesa including the first and second sidewalls.

16. The method according to claim 12, further comprising:
prior to doping with the dopant of the second conductivity type into the first sidewall surface of the at least one mesa, forming a tetraethylorthosilicate (TEOS) liner over the bottoms of at least the trenches adjacent to the at least one mesa and the at least one mesa including the first and second sidewalls.

17. The method according to claim 12, further comprising:
forming a layer of undoped polysilicon over the bottoms of at least the trenches adjacent to the at least one mesa and the at least one mesa including the first and second sidewalls.

18. The method according to claim 12, the step of filling at least the trenches adjacent to the at least on mesa with one of a semi-insulating material and an insulating material includes filling at least the trenches adjacent to the at least on mesa with at least one of undoped polysilicon, doped polysilicon, doped oxide, undoped oxide, silicon nitride and semi-insulating polycrystalline silicon (SIPOS).

19. The method according to claim 12, wherein the first sidewall surface has a first predetermined inclination angle maintained relative to the first main surface and the second sidewall surface has a second predetermined inclination angle maintained relative to the first main surface.

20. The method according to claim 12, wherein the first and second sidewall surfaces are generally perpendicular relative to the first main surface.

21. The method according to claim 12, wherein the plurality of trenches are formed by etching the semiconductor substrate.

22. A semiconductor device formed by the method of claim 12.

* * * * *